(12) United States Patent
Kurita et al.

(10) Patent No.: US 7,244,306 B2
(45) Date of Patent: Jul. 17, 2007

(54) METHOD FOR MEASURING POINT DEFECT DISTRIBUTION OF SILICON SINGLE CRYSTAL INGOT

(75) Inventors: Kazunari Kurita, Tokyo (JP); Jun Furukawa, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 27 days.

(21) Appl. No.: 10/531,434

(22) PCT Filed: Oct. 17, 2003

(86) PCT No.: PCT/JP03/13320

§ 371 (c)(1),
(2), (4) Date: Feb. 17, 2006

(87) PCT Pub. No.: WO2004/035879

PCT Pub. Date: Apr. 29, 2004

(65) Prior Publication Data

US 2006/0130738 A1 Jun. 22, 2006

(30) Foreign Application Priority Data

Oct. 18, 2002 (JP) .............................. 2002-304410

(51) Int. Cl.
*C30B 15/20* (2006.01)
(52) U.S. Cl. .............................. 117/13; 117/14; 117/15; 117/20; 117/202; 117/932
(58) Field of Classification Search .................. 117/13, 117/14, 15, 20, 202, 932
See application file for complete search history.

(56) References Cited

U.S. PATENT DOCUMENTS 5,418,172 A * 5/1995 Falster et al. ................. 438/17

(Continued)

FOREIGN PATENT DOCUMENTS

GB 2 324 652 10/1998

(Continued)

OTHER PUBLICATIONS

Abstract only of Publication No. 2002-102385 published Apr. 13, 2001, Mitsubishi Materials Silicon, "Silicon wafer without aggregate of dot-like defect".

*Primary Examiner*—Felisa Hiteshew
(74) *Attorney, Agent, or Firm*—Reed Smith LLP

(57) ABSTRACT

A single crystal ingot is cut to an axial direction so as to including the central axis, a sample for measurement including regions [V], [Pv], [Pi] and [I] is prepared, and a first sample and second sample are prepared by dividing the sample into two so as to be symmetrical against the central axis. A first transition metal is metal-stained on the surface of the first sample and a second transition metal different from the first transition metal is metal-stained on the surface of the second sample. The first and second samples stained with the metals are thermally treated and the first and second transition metals are diffused into the inside of the samples. Recombination lifetimes in the whole of the first and second samples are respectively measured, and the vertical measurement of the first sample is overlapped on the vertical measurement of the second sample. The boundary between the regions [Pi] and [I] and the boundary between the regions [V] and [Pv] are respectively specified from the overlapped result.

14 Claims, 18 Drawing Sheets

U.S. PATENT DOCUMENTS

| | | |
|---|---|---|
| 6,045,610 A | 4/2000 | Park et al. |
| 6,638,357 B2 * | 10/2003 | Mule'Stagno et al. .......... 117/2 |
| 7,074,271 B2 * | 7/2006 | Furukawa et al. ............ 117/13 |
| 2001/0025597 A1 * | 10/2001 | Falster et al. ................. 117/13 |
| 2003/0116281 A1 * | 6/2003 | Falster et al. ................. 117/13 |
| 2004/0025782 A1 * | 2/2004 | Falster et al. ................. 117/3 |
| 2005/0238905 A1 * | 10/2005 | Falster et al. ............... 428/620 |

FOREIGN PATENT DOCUMENTS

| | | |
|---|---|---|
| JP | 11-1393 | 6/1999 |
| JP | 2002-47094 | 2/2002 |

* cited by examiner

Fig. 14
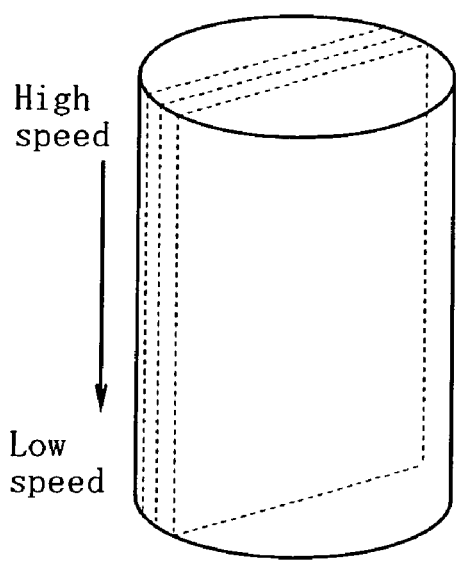
(a)
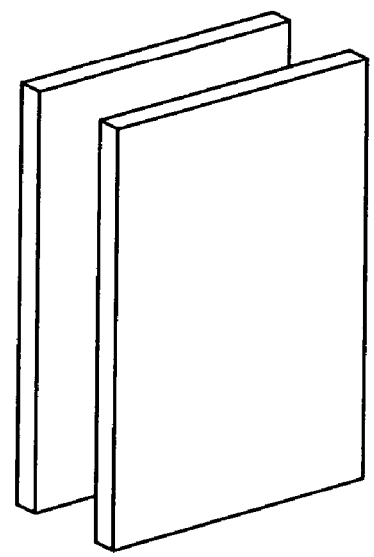
(b)

⟍⟍⟍ Region with high concentration of Fe recombination

⋯⋯ Region with middle concentration of Fe recombination

⁄⁄⁄ Region with low concentration of Fe recombination

⟍⟍⟍ Region with high concentration of Fe recombination

⋯⋯ Region with middle concentration of Fe recombination

⁄⁄⁄ Region with low concentration of Fe recombination

METHOD FOR MEASURING POINT DEFECT DISTRIBUTION OF SILICON SINGLE CRYSTAL INGOT

CROSS-REFERENCES TO RELATED APPLICATIONS

This application claims International Application PCT/JP2003/013320 filed Oct. 17, 2003, which claims priority of the Japanese Application No. 2002-304410 filed Oct. 18, 2002, the entire disclosure of which are hereby incorporated by reference.

TECHNICAL FIELD

The present invention relates to a method for measuring the defect distribution of intrinsic point defect which is formed in a silicon single crystal ingot (hereinafter, referred to as an ingot), or a p-type silicon single crystal ingot (hereinafter, referred to as a p-type ingot) which is pulled up by a Czochralski method (hereinafter, referred to as the CZ method). More specifically, the present invention relates to a method of evaluating the defect distribution of intrinsic point defect of a silicon wafer which makes the production of a no defects region silicon wafer easy.

BACKGROUND ART

As a factor which lowers the yield of a device in accordance with the ultra miniaturization of a recent semiconductor integrated circuit, there is mentioned the existence of a crystal originated particle (hereinafter, referred to as COP) which is a defect introduced at growth of a crystal which is formed during the crystal growth of a silicon single crystal ingot, a minute defect of oxygen precipitate which is the nucleus of oxidation induced stacking fault (hereinafter, referred to as OISF), or an interstitial-type large dislocation (hereinafter, referred to as L/D).

The COP is a pit originated in a crystal which appears on the surface of a wafer when a silicon wafer which is polished in mirror surface is rinsed by the SC-1 method with a mixed solution of ammonia and hydrogen peroxide. When the wafer is measured with a particle counter, the pit is detected as particles (Light Point Defect; LPD). The COP is a cause for deteriorating electric properties such as, for example, the time dependent dielectric breakdown (TDDB) of an oxide film and the time zero dielectric breakdown (TZDB) of an oxide film. Further, when the COP exists on the surface of a wafer, a bump is generated at the wiring step of a device to be possibly the cause of disconnection. It becomes also the cause of leakage and the like at portion separating an element and the yield of a product is lowered.

It is considered that a minute oxygen precipitation which is formed at crystal growth is the nucleus of OISF, and the OISF is a stacking defect which is exposed at a thermal oxidation step when a semiconductor device is produced. The OISF becomes the cause of trouble of increasing the leak current of the device, and the like. The L/D is also called as dislocation cluster, or also called as dislocation pit because when a silicon wafer generating the defect is immersed in a selective etching solution in which fluoric acid is a main component, etching pit having orientation is generated. The L/D is also a cause of deteriorating electric properties such as, for example, leak property and isolation property.

From the above reasons, it is necessary to reduce COP, OISF and L/D from a silicon wafer which is used for producing a semiconductor integrated circuit.

A defect-free ingot having no COP, OISF and L/D and a silicon wafer which is sliced from the ingot are disclosed in JP-A-11-1393 corresponding to U.S. Pat. No. 6,045,610. The defect-free ingot is an ingot comprising a perfect region [P] when the perfect region in which a agglomerate of vacancy type point defects and interstitial silicon type point defects in the ingot are respectively not detected is referred to as [P]. The perfect region [P] exists between a region [V] having defects where the vacancy type point defect is dominant in an ingot and excessively saturated vacancies are agglomerated and a region [I] having defects where the interstitial silicon type point defect is dominant and excessively saturated interstitial silicons are agglomerated.

Further, it is indicated in JP-A-2001-102385 that the perfect region [P] having no defect where the point defects are agglomerated is classified into a region [Pv] where the vacancy type point defect is dominant and a region [Pi] where the interstitial silicon type point defect is dominant. The [Pv] region is adjacent to the [V] region and a region having a concentration of vacancy type point defect which is less than the minimum concentration of vacancy type point defect which can form a OISF nuclei. The [Pi] region is adjacent to the [I] region and a defect region having a concentration of interstitial silicon type point defect which is less than the minimum concentration of interstitial silicon type point defect which can form an interstitial-type dislocation.

When the pulling-up speed of an ingot is set as V (mm/min.) and a temperature gradient to the vertical direction of the ingot nearby the solid-liquid interface between silicon melt and the silicon ingot is set as G (° C./mm), an ingot comprising the perfect region [P] is prepared within a range of V/G (mm$^2$/min.·° C.) in a region where OISF (P band) which is generated in a ring form at thermal oxidation processing is extinguished at the center of a wafer and L/D (B band) is not generated.

Since it is important to control the concentration distribution of point defect to an axial direction and a diameter direction in order to produce a defect-free silicon wafer, the following method has been conventionally adopted for measuring secondary defect which is generated by thermal processing in an ingot, namely, agglomerated defect distribution. Firstly, a silicon single crystal ingot is prepared at a condition by which a defect-free region is formed, for evaluation of the concentration distribution of point defect to an axial direction and a diameter direction. Then, a sample is prepared by slicing the ingot to an axial direction. Then, after the sample is mirror-etched, it is thermally treated at 800° C. for 4 hours under nitrogen or oxidative atmosphere and thermally treated at 1000° C. for 16 hours, successively. The sample thermally treated is measured by measurement methods such as the copper-decoration, the secco-etching, the X-ray topography and the lifetime measurement. As shown in FIGS. 23 and 24, since oxygen precipitate appears in the ingot by the above-mentioned thermal treatment, respective region and respective boundary have been discriminated and judged from the oxygen precipitates. Hereat, FIG. 23 is a chart showing the in-plane distribution of recombination lifetime when the thermal heat treatment for oxygen precipitation is carried out for a sample containing the regions [V], [Pv], [Pi] and [I] which is prepared by changing the pulling-up speed from a high speed to a low speed by a crystal pulling-up apparatus having a hot zone which can prepare a defect-free silicon single crystal ingot, and FIG. 24 is a chart showing the recombination lifetime in the A-A line section of FIG. 23.

However, in case of the above-mentioned measurement method, it is known that the measurement value of recombination lifetime is remarkably dependent on the oxygen concentration in a sample and the thermal heat treatment for oxygen precipitation condition. For example, when the concentration of oxygen dissolved in an ingot is low, the density of the oxygen precipitate which is formed by the thermal heat treatment for oxygen precipitation is low in comparison with a sample in which the concentration of dissolved oxygen is high; therefore the difference value of the recombination lifetimes becomes small.

On the other hand, when the concentration of oxygen dissolved in an ingot is high, the amount of oxygen precipitates is also excessively large depending on the concentration of oxygen dissolved in the regions [Pv] and [Pi] and the difference between the measurement values of diffusion lengths of minor carrier in the regions [Pv] and [Pi] is small; therefore the difference is not clear. Thus, there has been a problem that the boundary region between the region [Pv] and the region [Pi] cannot be cleared in low oxygen concentration and high oxygen concentration.

Further, thermal treatment for a long time is not only required for the thermal heat treatment for oxygen precipitation, but also the condition of the thermal treatment affects the oxygen precipitation in an ingot; therefore the boundary region of the point defect regions is shifted to either region side of the region [Pv] or the region [Pi]. Consequently, it is difficult to discriminate and judge the original point defect region.

It is the purpose of the present invention to provide a method for measuring the point defect distribution of a silicon single crystal ingot which identifies the regions [Pv] and [Pi] in an ingot and boundary thereof with high precision and a short time without depending on the concentration of oxygen dissolved in the ingot.

DISCLOSURE OF INVENTION

As shown in FIG. 1, the invention according to claim 1 is a method for measuring the point defect distribution of a silicon single crystal ingot, comprising (a1) a step of preparing a sample for measurement including regions [V], [Pv], [Pi] and [I] by cutting to an axial direction a silicon single crystal ingot which is pulled up by changing a pulling-up speed from silicon melt so as to include the central axis of the single crystal ingot, (b1) a step of preparing a first sample and a second sample by dividing the sample for measurement into two so as to be symmetrical against the central axis of the ingot, (c1) a step of coating a first transition metal solution dissolving a first transition metal at a concentration of 1 to 1000 ppm on the surface of the first sample to stain or contaminate the sample with the metal, (d1) a step of coating a second transition metal solution dissolving a second transition metal different from the first transition metal at a concentration of 1 to 1000 ppm on the surface of the second sample to stain or contaminate the sample with the metal, (e1) a diffusion thermal treatment step of thermally treating the first and second samples stained or contaminated with the metals at 600° C. to 1150° C. for 0.5 hour to 30 hours under argon, nitrogen, oxygen, hydrogen or mixed gas atmosphere thereof and diffusing the first and second transition metals which are respectively coated on the surface of the first and second samples into the inside of the samples, (f1) a step of respectively measuring recombination lifetimes in the whole of the first and second samples which are thermally treated, (g1) a step of overlapping the vertical measurement of the first sample of the step (f1) on the vertical measurement of the second sample, and (h1) a step of respectively specifying the boundary between the regions [Pi] and [I] and the boundary between the regions [V] and [Pv] from the measurement result of the step (g1).

Provided that the regions [V] is a region having defects where the vacancy type point defect is dominant and excessive vacancies are agglomerated, the region [Pv] is a region having defects where the vacancy type point defect is dominant and vacancies are not agglomerated, the region [Pi] is a region having defects where the interstitial silicon type point defect is dominant and interstitial silicon are not agglomerated, and the region [I] is a region having defects where the interstitial silicon type point defect is dominant and interstitial silicons are agglomerated.

In the invention according to claim 1, the regions [Pi] and [I] and boundary thereof are specified with high precision and a short time without depending on the concentration of oxygen dissolved in an ingot, by combining the recombination lifetime distribution of the first transition metal which specifies the boundary of the regions [V] and [Pv] with high precision, with the recombination lifetime distribution of the second transition metal which specifies the boundary of the regions [Pi] and [I] with high precision.

As shown in FIG. 7, the invention according to claim 2 is a method for measuring the point defect distribution of a silicon single crystal ingot, comprising (a2) a step of preparing a sample for measurement including regions [V], [Pv], [Pi] and [I] by cutting to an axial direction a silicon single crystal ingot which is pulled up by changing a pulling-up speed from silicon melt so as to include the central axis of the single crystal ingot, (b2) a step of preparing a first sample and a second sample by dividing the sample for measurement into two so as to be symmetrical against the central axis of the ingot, (c2) a step of coating a first transition metal solution dissolving a first transition metal at a concentration of 1 to 1000 ppm on the surface of the first sample to stain or contaminate the sample with the metal, (d2) a step of coating a second transition metal solution dissolving a second transition metal different from the first transition metal at a concentration of 1 to 1000 ppm on the surface of the second sample to stain or contaminate the sample with the metal, (e2) a diffusion thermal treatment step of thermally treating the first and second samples stained or contaminated with the metals at 600° C. to 1150° C. for 0.5 hour to 30 hours under argon, nitrogen, oxygen, hydrogen or mixed gas atmosphere thereof and diffusing the first and second transition metals which are respectively coated on the surface of the first and second samples into the inside of the samples, (f2) a step of respectively measuring recombination lifetimes in the whole of the first and second samples which are thermally treated, (g2) a step of overlapping the vertical measurement of the first sample of the step (f2) on the vertical measurement of the second sample, (i2) a step of determining the vertical concentration of the first transition metal by the TID method with respect to the first sample which is thermally treated, (j2) a step of determining the vertical concentration of the second transition metal by the DLTS method with respect to the second sample which is thermally treated, (k2) a step of preparing the correlation straight line between the concentration of the first transition metal and the recombination lifetime from the vertical measurement result in the first sample of the step (f2) and the measurement result of the step (i2), (l2) a step of preparing the correlation straight line between the concentration of the second transition metal and the recombination lifetime from the vertical measurement result in the second sample of the step (f2) and the measurement result of the step (j2), and (m2) a step of respectively specifying the boundary between the regions [V] and [Pv] and the boundary between the regions [Pi] and [I] from the measurement result of the step (g2), the correlation straight line of the step (k2) and the correlation straight line of the step (l2).

Provided that the regions [V], [Pv], [Pi] and [I] have the same meaning as those respectively described in claim 1, the TID method is a method of quantifying the concentration of Cu dissolved in a silicon single crystal from the analysis of transient capacitance property of a metal semiconductor junction diode, and the DLTS method is a method of applying pulse voltage to a positive direction in a condition in which electric field to a reverse direction against the junction (or interface) and capturing a carrier with a level in a depletion layer.

In the invention according to claim 2, the regions [Pv] and [Pi] and boundary thereof are specified with high precision and a short time without depending on the concentration of oxygen dissolved in an ingot from the combined recombination lifetime distributions and the two correlation straight lines, by combining the recombination lifetime distribution of the first transition metal with the recombination lifetime distribution of the second transition metal, and further, respectively preparing the correlation straight line from the metal concentration of the first transition metal and the recombination lifetime distribution of the first transition metal and similarly, the correlation straight line from the metal concentration of the second transition metal and the recombination lifetime distribution of the second transition metal.

The invention according to claim 3 is the invention according to claim 1 and the measurement method wherein the first transition metal is Cu or Fe and the second transition metal is Ni or Co.

In the invention according to claim 3, when a combination that the first transition metal is Cu and the second transition metal is Ni is used among the above-mentioned first and second transition metals, the recombination lifetimes of the regions [Pv] and [Pi] are remarkably different; therefore the boundary between the regions [Pv] and [Pi] can be clearly identified.

The invention according to claim 4 is the invention according to claim 2 and the measurement method wherein the first transition metal is Cu and the second transition metal is Fe.

The invention according to claim 5 is the invention according to claim 1 or 2, and the measurement method wherein the diffusion thermal treatment step of the first and second transition metals in the step (e1) or (e2) is a thermal treatment at 600° C. to 1150° C. for 0.5 hour to 24 hours.

The invention according to claim 6 is the invention according to claim 1 or 2 and the measurement method wherein the measurement of the recombination lifetime in the step (f1) or (f2) is measured using the LM-PCD (laser/microwave photoconductance decay method).

The invention according to claim 7 is the invention according to claim 1 or 3 and the measurement method, further comprising a step of selectively etching the surface of the second sample which is thermally treated with the step (e1) when the second transition metal with which the second sample is metal-stained is Ni.

When the second transition metal is Ni, nickel silicide is formed on the surface of the sample by carrying out diffusion thermal treatment to the second sample. When nickel silicide is formed, in the following recombination lifetime measurement step, surface recombination speed is increased and there is generated a problem that an accurate value cannot be measured. Consequently, nickel silicide is removed by selectively etching the surface of the sample.

As shown in FIG. 13, The invention according to claim 8 is a method for measuring the point defect distribution of a silicon single crystal ingot, comprising (a3) a step of preparing a sample for measurement including regions [V], [Pv], [Pi] and [I] by cutting to an axial direction a p-type silicon single crystal ingot which is pulled up by changing a pulling-up speed from silicon melt doped with boron, (b3) a step of coating a transition metal solution dissolving a transition metal M at a concentration of 1 to 1000 ppm on the surface of the sample to stain or contaminate the sample with the metal, (c3) a diffusion thermal treatment step of rapidly charging the sample stained or contaminated with the metal into a thermally treating furnace which is retained at a first temperature of 600° C. to 900° C., under argon, nitrogen, oxygen, hydrogen or mixed gas atmosphere thereof, thereby rapidly heating the sample at a temperature raising speed of 3.3° C./min. or more to thermally treat the sample for 0.5 hour to 4 hours, rapidly cooling the sample at a temperature cooling speed of 3.3° C./min. or more by rapidly taking out the sample from the thermally treating furnace and diffusing the transition metal M which is coated on the surface of the sample into the inside of the sample, (d3) a silicide forming thermal treatment step of rapidly charging the sample into a thermally treating furnace which is retained at a second temperature of 450° C. to 550° C. lower than the first temperature by 150° C. to 450° C., under argon, nitrogen, oxygen, hydrogen or mixed gas atmosphere thereof, thereby rapidly heating the sample at a temperature raising speed of 3.3° C./min. or more to thermally treat the sample for 0.5 hour to 4 hours, rapidly cooling the sample at a temperature cooling speed of 3.3° C./min. or more by rapidly taking out the sample from the thermally treating furnace and forming metal silicide from the transition metal M which is diffused into the inside of the sample, (e3) a dissolution thermal treatment step of rapidly charging the sample into a thermally treating furnace which is retained at a third temperature of 900° C. to 1100° C. higher than the second temperature by 450° C. to 550° C., under argon, nitrogen, oxygen, hydrogen or mixed gas atmosphere thereof, thereby rapidly heating the sample at a temperature raising speed of 3.3° C./min. or more to thermally treat the sample for 0.5 hour to 4 hours, rapidly cooling the sample at a temperature cooling speed of 3.3° C./min. or more by rapidly taking out the sample from the thermally treating furnace and dissolving the metal silicide which is formed in the inside of the sample, (f3) a step of measuring the concentration of the recombination center which the transition metal M forms in the whole sample which undergoes the dissolution thermal treatment and determining a correlation function from the measurement result, (g3) a step of measuring the diffusion length of minor carrier in the whole sample which undergoes the dissolution thermal treatment, (h3) a step of injecting heat or optical energy in the sample, (i3) a step of measuring the diffusion length of minor carrier in the whole sample in which the heat or optical energy is injected, (j3) a step of determining the difference of the diffusion lengths of minor carrier from the measurement result of the step (g3) and the measurement result of the step (i3), and (k3) a step of specifying the regions [Pv] and [Pi] and boundary thereof from the correlation function obtained in the step (f3) and the difference of the diffusion lengths of minor carrier obtained from the step (j3).

In the invention according to claim 8, the regions [Pv] and [Pi] and boundary thereof are specified with high precision and a short time without depending on the concentration of oxygen dissolved in an ingot, by using the high temperature dependency of dissolution thermal treatment of the transition metal M.

The invention according to claim 9 is the invention according to claim 8 and the measurement method wherein the transition metal M is Fe.

The invention according to claim 10 is the invention according to claim 8 and the measurement method wherein the minor carrier diffusion lengths in the steps (g3) and (f3) are measured using the SPV (surface photo-voltage method).

The invention according to claim 11 is the invention according to claim 8 and the measurement method wherein the concentration of recombination center of the transition metal M in the step (f3) is measured using the DLTS (deep level transient spectroscopy).

BRIEF DESCRIPTION OF DRAWINGS

FIG. 11 is a chart showing a calibration line when the reciprocal number of a measurement value of the first sample with a low oxygen concentration by the LM-PCD method and a measurement value by the TID method were plotted, in the step (k2) of the second measurement method of the present invention.

FIG. 12 is a chart showing a calibration line when the reciprocal number of a measurement value of the second sample with a low oxygen concentration by the LM-PCD method and a measurement value by the DLTS method were plotted, in the step (l2) of the second measurement method of the present invention.

FIG. 14 is a chart showing situation preparing a sample for measurement from a p-type ingot in the step (a3) of the third measurement method of the present invention.

[V], [Pv], [Pi] and [I] which were prepared by a crystal pulling-up device having a hot zone capable of preparing a defect-free silicon single crystal ingot.

Figure 23:
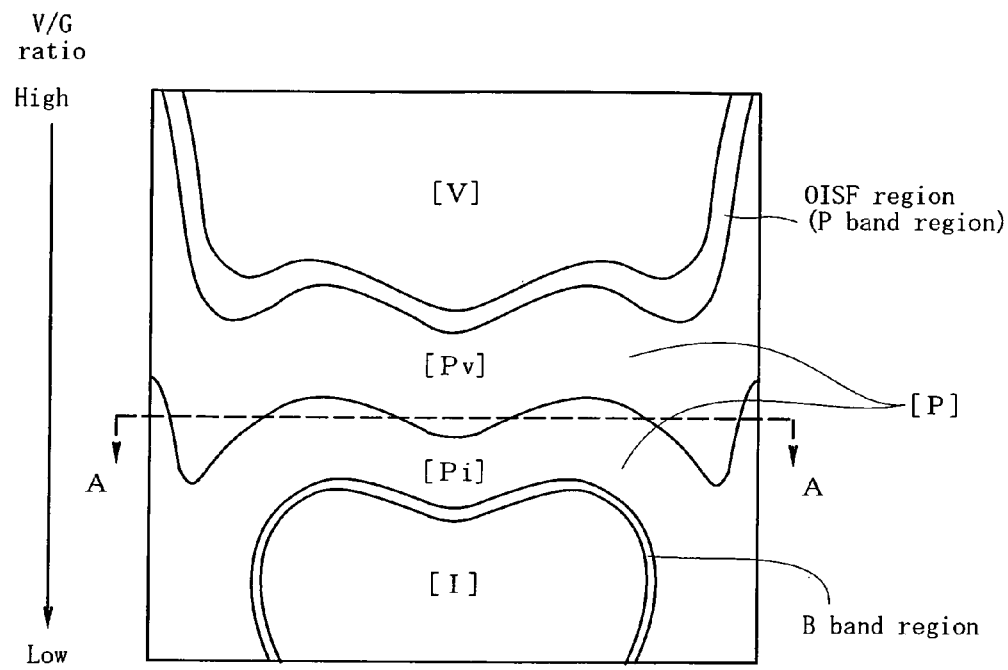
FIG. 23 is a chart showing the in-plane distribution of recombination lifetime in case of carrying out the precipitating thermal treatment of the sample containing the regions
Figure 24:
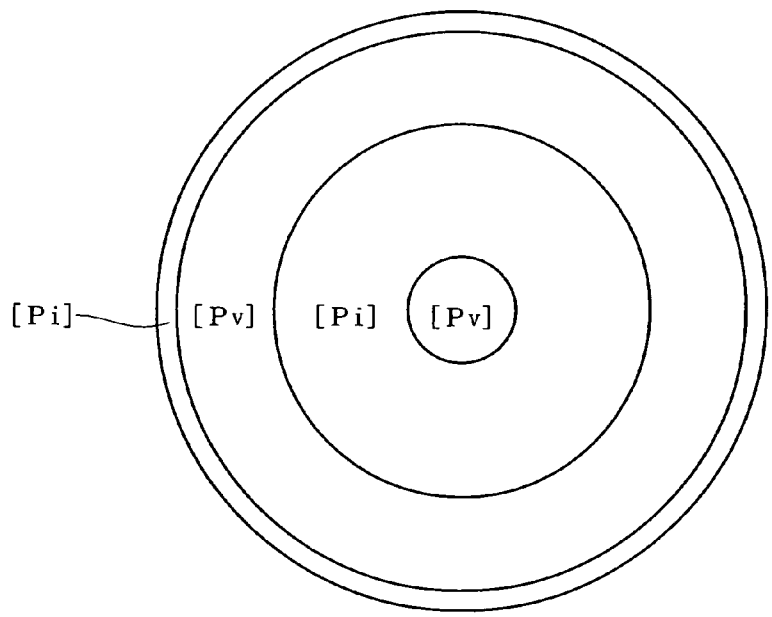

FIG. 24 is a chart showing the recombination lifetime in the A-A line section of FIG. 23.

BEST MODE FOR CARRYING OUT THE INVENTION

Ingot Being Objective of Measurement Method of Present Invention (1) The ingot being the objective of the first and second measurement methods of the present invention is pulled up from silicon melt by controlling a V/G ratio so as to include the regions [V], [Pv], [Pi] and [I].

Further, the ingot is an ingot in which its oxygen concentration is a range of $8.0 \times 10^{17}$ atoms/cm$^3$ to $1.0 \times 10^{18}$ atoms/cm$^3$ (old ASTM, hereinafter, it is the same), or the boundary of the regions [Pv] and [Pi] in a sample which is obtained by slicing the ingot to be thermally treated at 800° C. for 4 hours under nitrogen atmosphere, successively, thermally treated at 1000° C. for 16 hours and then in which the recombination lifetime is measured, cannot be identified.

The ingot being the objective of the third measurement method of the present invention is pulled up from silicon melt doped with boron, by controlling a V/G ratio so as to include the regions [V], [Pv], [Pi] and [I].

The ingot is pulled up from silicon melt in a hot zone furnace based on the theory of Voronkov by the CZ method or the magnetic field applied CZ method. In general, when a silicon single crystal ingot is pulled up from silicon melt in a hot zone furnace by the CZ method or the magnetic field applied CZ method, point defect and the agglomerate of point defects (agglomerates: three dimensional defect) are generated as defects in the silicon single crystal. There are two general modes of vacancy type point defect and interstitial silicon type point defect in the point defects. The vacancy type point defect is a defect in which one silicon atom is separated from one of normal positions in a silicon crystal lattice. Such vacancies are agglomerated to form the vacancy type defect. On the other hand, interstitial silicons are agglomerated to form the interstitial silicon type defect.

The point defect is generally introduced at a contact plane between silicon melt (melted silicon) and an ingot (solid silicon). However, when the ingot is continuously pulled up, a portion which is the contact plane is cooled in accordance with pulling-up. The vacancy or the interstitial silicon carries out diffusion and pair annihilation reaction during cooling. Excessive point defects at the time of cooling until about 1100° C. form the agglomerates of the vacancy type point defects (vacancy agglomerates) or the agglomerates of the interstitial silicon type point defects (interstitial agglomerates). In other word, they are three dimensional structures which the excessive point defects form agglomerates and generate.

The vacancy agglomerates include defects called as LSTD (Laser Scattering Tomograph Defects) or FPD (Flow Pattern Defects) in addition to the fore-mentioned COP, and the interstitial agglomerates include the fore-mentioned defect called as L/D. FPD is the source of trace exhibiting a specific flow pattern which appears when the secco-etching (etching by a mixed solution of HF:K$_2$Cr$_2$O$_7$ (0.15 mol/l)=2:1) of silicon wafer which is prepared by slicing an ingot is carried out. LSTD is a source which has a refractive index different from silicon, and which generate scattered light when infrared ray is irradiated into a silicon single crystal.

Figure 2:
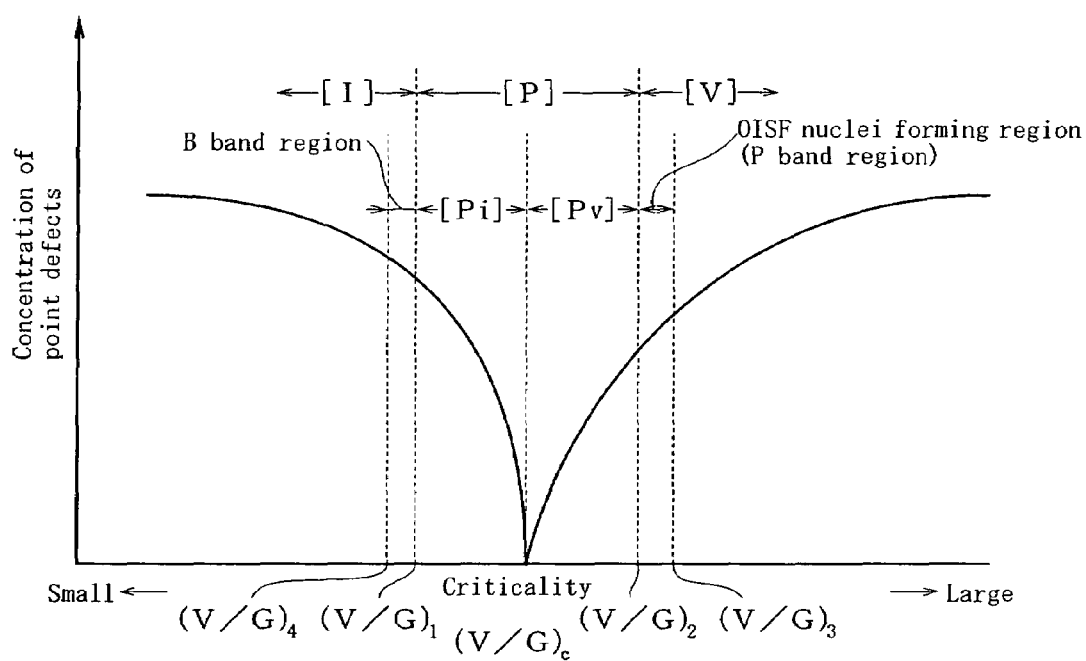
FIG. 2 is a chart showing relation between V/G and a point defect concentration based on the theory of Voronkov, by setting V/G as a horizontal axis and setting a vacancy type point defect concentration and an interstitial silicon type point defect concentration as the same longitudinal axis.

The theory of Voronkov is that when the pulling-up speed of an ingot is set as V (mm/min.) and when the temperature gradient nearby solid-liquid interface between silicon melt and a silicon ingot is set as G (° C./mm), V/G (mm$^2$/min.·° C.) is controlled in order to grow a high purity ingot with little number of defect. In the theory, as shown in FIG. 2, the relation between V/G and a point defect concentration is schematically represented by setting V/G as a horizontal axis and setting the concentration of the vacancy type point defects and the concentration of the interstitial silicon type point defects as the same longitudinal axis, and the theory explains the boundary between a vacancy region and an interstitial silicon region is determined by V/G. More specifically, when the V/G ratio is a critical point (V/G)$_c$ or more, an ingot in which the concentration of vacancy is raised is formed, and to the contrary, when the V/G ratio is the critical point (V/G)$_c$ or less, an ingot in which the concentration of interstitial silicon is raised is formed. In FIG. 2, [I] indicates a region ((V/G)$_1$ or less) having defects where the interstitial silicon is dominant and interstitial silicons are agglomerated, [V] indicate a region ((V/G)$_2$ or more) having defects where vacancy is dominant and vacancies are agglomerated, and [P] indicates a perfect region ((V/G)$_1$ to (V/G)$_2$) where the vacancy agglomerates and the interstitial agglomerates do not exist. A P band region ((V/G)$_2$ to (V/G)$_3$) forming the OISF nucleus exists at the boundary with the region [V] at a side adjacent to the region [P]. Minute tabular precipitate exists at the P band region and OISF (laminated defect) is formed by thermal treatment under oxidative atmosphere. Further, a B band region ((V/G)$_4$ to (V/G)$_1$) exists at the boundary of the region [I] at a side adjacent to the region [P]. The B band region is a region in which the agglomerate of the interstitial silicons becomes nucleus and oxygen precipitation is generated at a high concentration by thermal treatment.

The perfect region [P] is further classified into a region [Pi] and a region [Pv]. [Pi] is a region in which the V/G ratio is from the above-mentioned (V/G)$_1$ to the critical point and a region having defects in which the interstitial silicon is dominant and interstitial silicons are not agglomerated. [Pv] is a region in which the V/G ratio is from the critical point to the above-mentioned (V/G)$_2$ and a region having defects in which the vacancy is dominant and vacancies are not agglomerated. Namely, [Pi] is adjacent to the region [I] and a region having the concentration of interstitial silicon which is less than the minimum concentration of interstitial silicon which can form interstitial dislocation, and [Pv] is adjacent to the region [V] and a region having the concentration of vacancy which is less than the minimum concentration of vacancy which can form OISF nucleus.

Accordingly, the ingot being the objective of the measurement method of the present invention is pulled up by being controlled so that the V/G ratio includes respective regions from the above-mentioned (V/G)$_4$ or less to the critical point and (V/G)$_3$ or more, in order to include the regions [V], [Pv], [Pi] and [I].

(2) First Measurement Method of Present Invention

Figure 1:
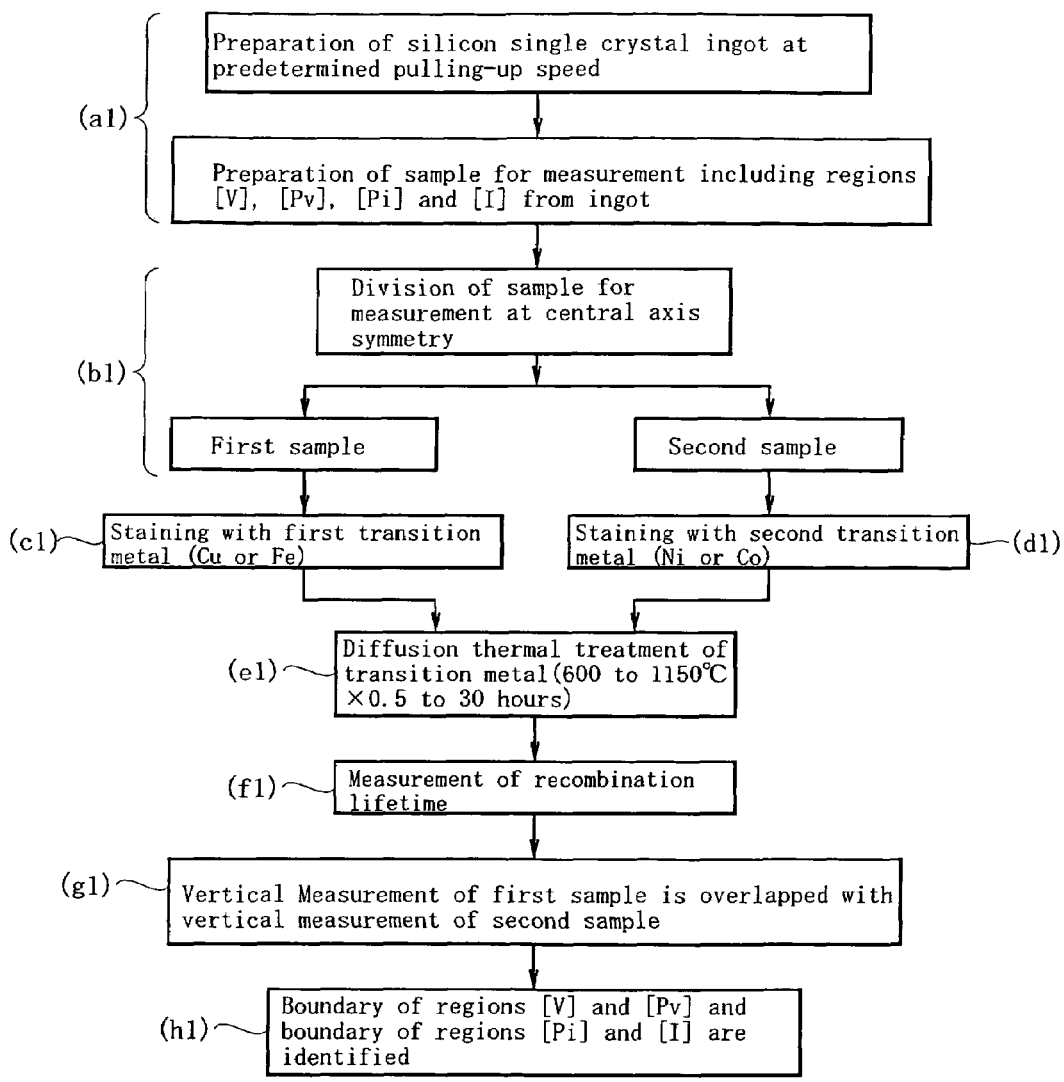
FIG. 1 is a flow chart related to a sample for measurement in the first measurement method of the present invention.
Figure 3:
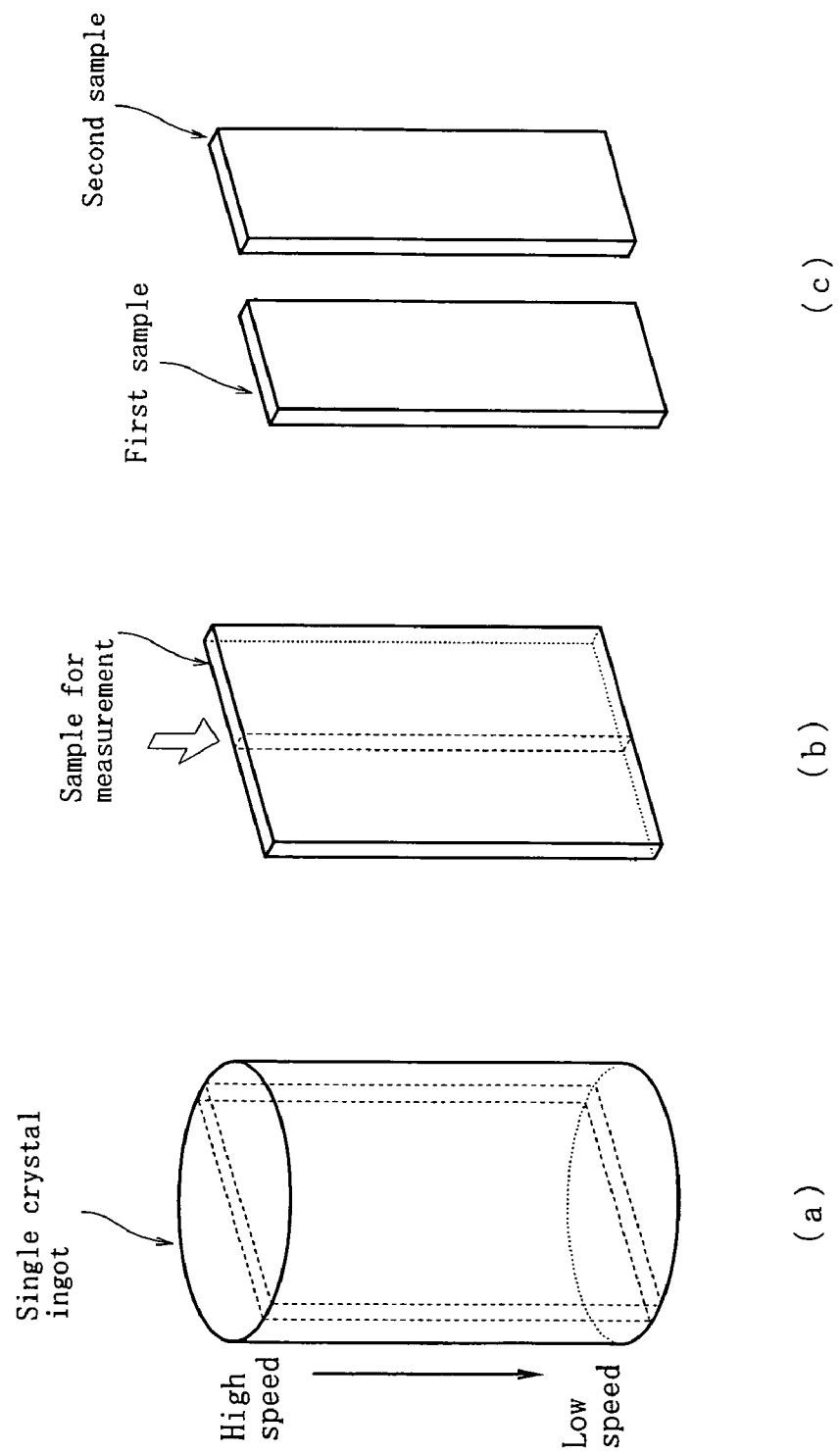
FIG. 3 is a chart showing situation preparing a first sample and a second sample from an ingot in the steps (a1) and (b1) of the first measurement method and the steps (a2) and (b2) of the second measurement method in the present invention.

Then, the first measurement method of the present invention is illustrated based on FIGS. 1 and 3.

As shown in FIG. 1, firstly, a sample for measurement is prepared from a test ingot (step (a1)). Namely, an ingot is pulled up from silicon melt which is stored in the quartz crucible of a pulling-up device based on the CZ method or the magnetic field applied CZ method. At this time, the ingot is pulled up by changing the pulling-up speed V (mm/min.) of the ingot from a high speed (top side) to a low speed (bottom side), or a low speed (bottom side) to a high speed (top side) so that the above-mentioned regions [V], [Pv], [Pi] and [I] are contained to the axis direction of the ingot.

As shown in FIG. 3, a sample for measurement having a thickness of 500 to 2000 μm whose surface is mirror-polished is prepared by cutting the ingot obtained in the test so as to include the central axis of the ingot to axis direction and by carrying out mirror-etching (FIGS. 3(a) and 3(b)). Each of the regions [V], [Pv], [Pi] and [I] is contained in the sample for measurement. The ingot shown in FIG. 3 is an ingot pulled up by changing the pulling-up speed V (mm/min.) from a high speed (top side) to a low speed (bottom side).

The concentration of oxygen dissolved in the sample for measurement is measured by the FT-IR (Fourier transform infrared absorption spectroscopy) method, and when the concentration of oxygen is $1.0\times10^{18}$ atoms/cm$^3$ or more, the sample is thermally treated at 800° C. for 4 hours and successively, thermally treated at 1000° C. for 16 hours, under nitrogen atmosphere. The recombination lifetime of the sample for measurement thermally treated is measured over the whole sample by the LM-PCD method. FIG. 23 is one example of the measurement result. As shown in FIG. 23, oxygen precipitate appeared in the sample in high density by the above-mentioned thermal treatment. The regions [V], [Pv], [Pi] and [I] are identified for the whole sample in accordance with concentration distribution of oxygen precipitate. The P band region forming OISF nucleus exists in the region [V] and the B band region exists in the region [I].

Figure 5:
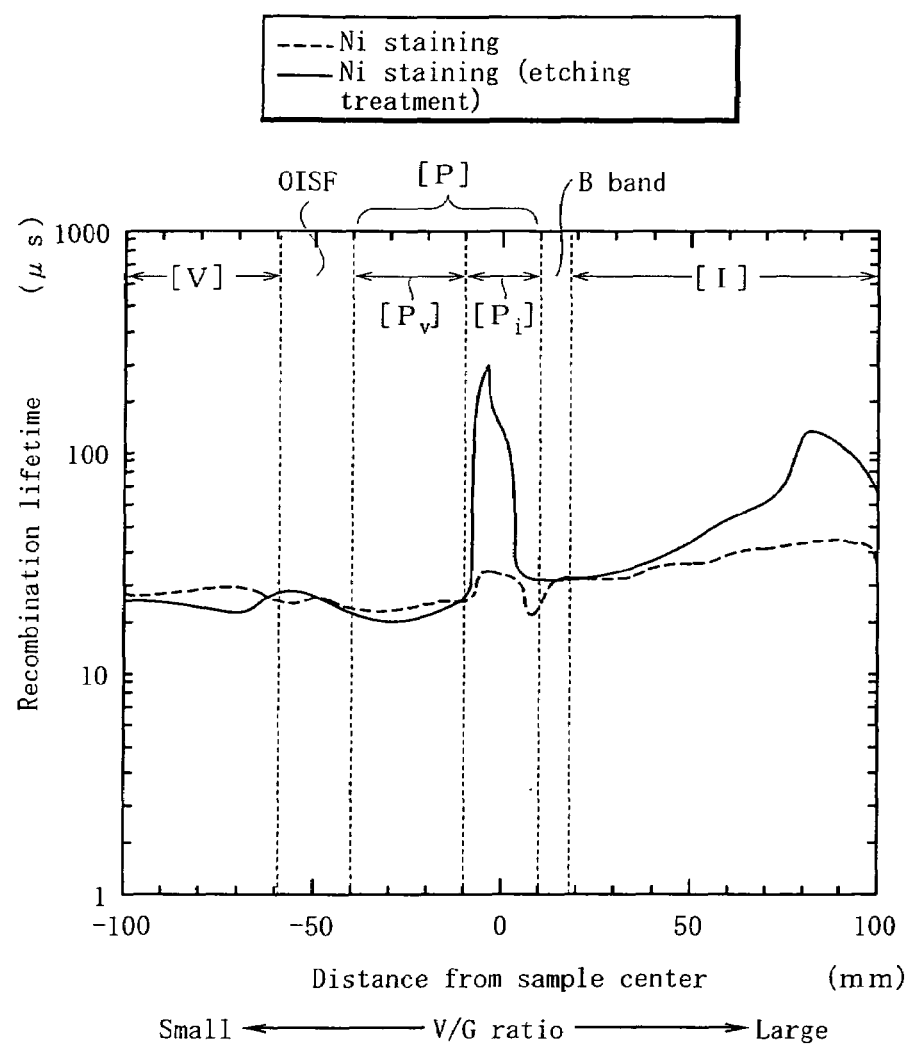
FIG. 5 is a chart showing the recombination lifetime of Ni of the whole sample before and after etching when the second sample with a low oxygen concentration in the first measurement method of the present invention was measured by the LM-PCD method.

On the other hand, when the concentration of oxygen of the sample for measurement is less than $1.0\times10^{18}$ atoms/cm$^3$, even if the sample for measurement is thermally treated in like manner as the above-description and the recombination lifetime of the sample for measurement is measured, it cannot be identified from the measurement result of the recombination lifetime whether the perfect region [P] is the region [Pv] or the region [Pi], as shown in FIG. 5.

Accordingly, in the present invention, the sample for measurement is divided into two so as to be symmetrical against the central axis of the ingot at a position shown in the arrow mark of FIG. 3(b) (step (b1)). The samples for measurement which are divided according to the above-mentioned step (b1) are set as a first sample and a second sample as shown in FIG. 3(c).

Returning to FIG. 1, a first transition metal solution in which a first transition metal is dissolved at a concentration of 1 to 1000 ppm is coated on the surface of the first sample to stain the first sample with the metal (step (c1)). The first transition metal is preferably Cu or Fe. The first transition metal solution is a solution in which the first transition metal is dissolved at a concentration of 1 to 1000 ppm and preferably 1 to 100 ppm. In particular, a standard solution for atomic absorption in which Cu or Fe is dissolved at a concentration of 10 to 100 ppm is preferred because of availability and superiority in concentration precision. The coating method includes the spin coat method, the dipping method and the like. When the concentration of the first transition metal is less than the lower limit value, the boundaries of respective regions cannot be adequately identified and the recombination lifetime cannot be measured in high precision. Further, when it exceeds the upper limit value, the transition metal is diffused on the surface and rear face of the sample and forms metal silicide (precipitate) nearby the surface and rear face; therefore recombination center which is a deep energy level cannot be formed in the inside (in crystal) of the sample.

A second transition metal solution in which a second transition metal different from the first transition metal is dissolved at a concentration of 1 to 1000 ppm is coated on the surface of the second sample to stain the second sample with the metal (step (d1)). The second transition metal is preferably Ni or Co. The second transition metal solution is a solution in which the second transition metal is dissolved at a concentration of 1 to 1000 ppm and preferably 1 to 100 ppm. In particular, a standard solution for atomic absorption in which Ni or Co is dissolved at a concentration of 10 to 100 ppm is preferred because of availability and superiority in concentration precision. As the coating method, a similar method as the above-mentioned coating method of the first transition metal is used. When the concentration of the second transition metal is less than the lower limit value, the boundaries of respective regions cannot be adequately identified and the recombination lifetime cannot be measured in high precision. Further, when it exceeds the upper limit value, the transition metal is diffused on the surface and rear face of the sample and forms metal silicide (precipitate) nearby the surface and rear face; therefore recombination center which is a deep energy level cannot be formed in the inside (in crystal) of the sample.

Then, the first and second samples are thermally treated at 600° C. to 1150° C. for 0.5 hour to 30 hours under argon, nitrogen, oxygen, hydrogen or mixed gas atmosphere thereof and the first and second transition metals which are respectively coated on the surface of the first and second samples are diffused into the whole samples (step (e1)). As the method of thermal treatment, temperature is raised at a speed of 0.5 to 10° C./min. and thermal treatment is carried out at 600° C. to 1150° C. for 0.5 hour to 30 hours and preferably for 0.5 hour to 24 hours. It is more preferable that temperature is raised at a speed of 5 to 10° C./min. and thermal treatment is carried out at 900° C. to 1000° C. for 1 hour to 2 hours. When the time and temperature of the thermal treatment is less than the lower limit value, the transition metal is not adequately diffused. Further, when they exceed the upper limit value, the transition metal is diffused on the surface and rear face of the sample and forms metal silicide (precipitate) nearby the surface and rear face; therefore recombination center which is a deep energy level cannot be formed in the inside (in crystal) of the sample.

If the second transition metal with which the second sample was stained was Ni, and when the recombination lifetime of the second sample thermally treated was measured, as shown in FIG. 5, the recombination lifetimes of the regions [Pi] and [I] were not adequately increased and the boundary between the regions cannot be identified. Since the diffusion coefficient of Ni is large in comparison with that of Cu or Fe of the first transition metal, Ni is precipitated nearby the surface of the sample by the thermal treatment. Therefore, the surface of the sample is etched with an etching solution containing $NH_3$, HF and $CH_3COOH$. Ni existing nearby the surface is removed by the etching. When the recombination lifetime of the second sample was measured again under the condition, the increase of the recombination lifetimes at the regions [Pi] and [I] was remarkable after the chemical etching and on the other hand, it is grasped that the recombination lifetime before and after the chemical etching was not changed at the region [V].

Figure 4:
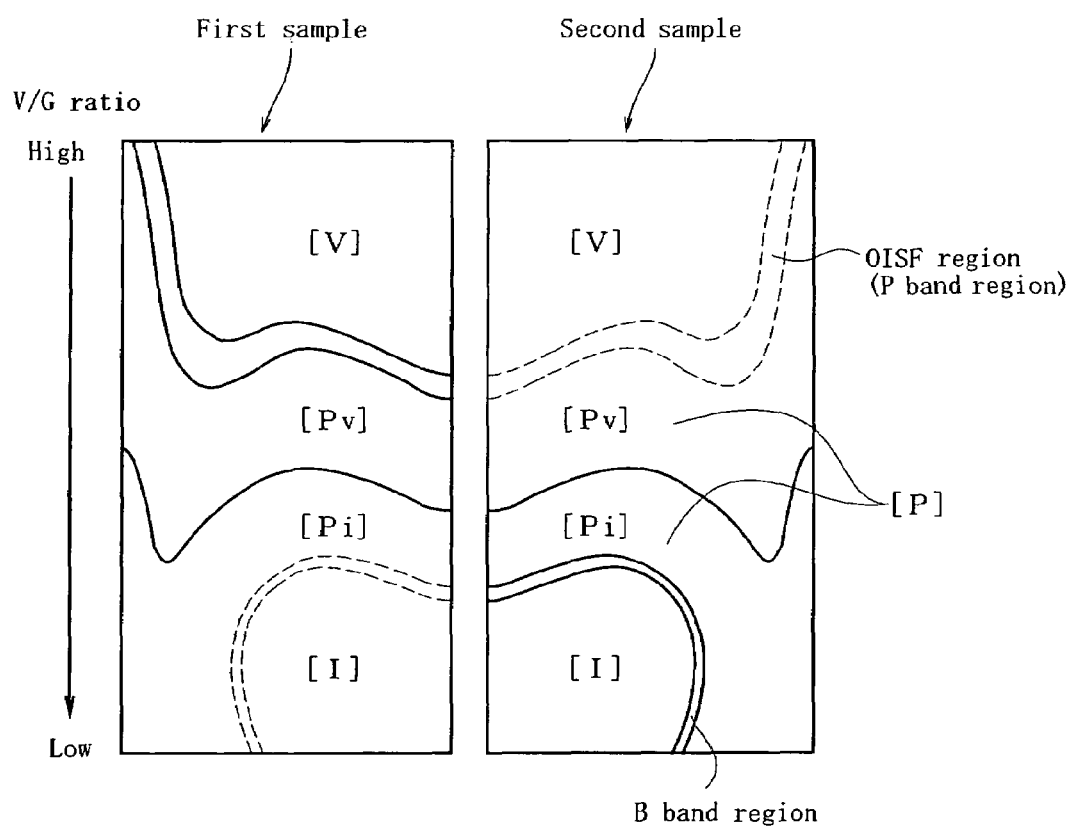
FIG. 4 is a chart showing the in-plane distribution of recombination lifetime in case of carrying out the diffusion thermal treatment of the first and second samples containing the regions [V], [Pv], [Pi] and [I] which were prepared by a crystal pulling-up device having a hot zone capable of preparing a defect-free silicon single crystal ingot in the step (f1) of the first measurement method of the present invention.

Then, the recombination lifetime of the transition metal is measured for the first and second samples which are thermally treated (step (f1)). The LM-PCD (laser/microwave photoconductance decay method) is preferable for the measurement. The recombination lifetime is quantified over the whole sample by the LM-PCD. The recombination lifetimes of the first and second samples are respectively shown in FIG. 4. As shown in FIG. 4, for the first sample, a region at which the recombination lifetime was the lowest was the region [Pi] and the highest region was the region [Pv]. For the second sample, a region at which the recombination lifetime was the lowest was the region [Pv] and the highest region was the region [Pi].

Figure 6:
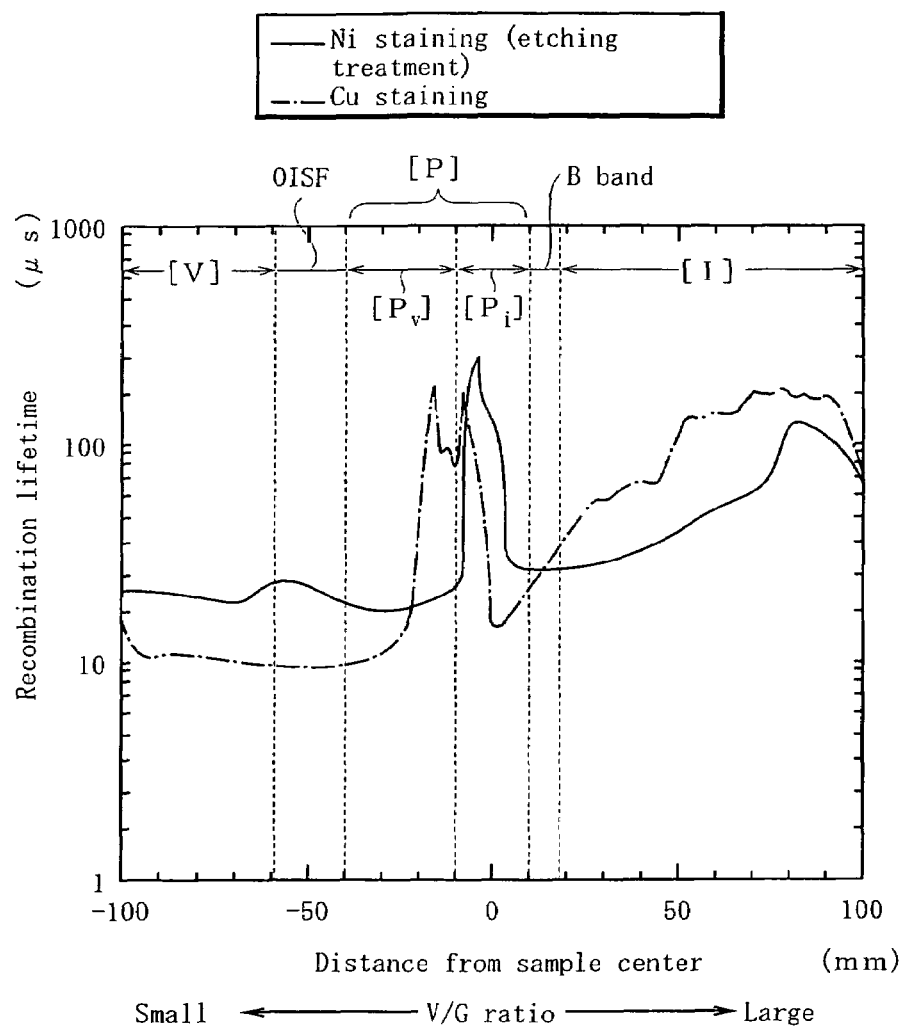
FIG. 6 is a chart showing the recombination lifetime distribution which was obtained by measuring the first and second samples with a low oxygen concentration in the step (g1) of the first measurement method of the present invention and vertically overlapping the recombination lifetimes obtained.

The recombination lifetimes of the first and second samples are measured and the vertical measurement of the first sample is overlapped with the vertical measurement of the second sample (step (g1)). Cu was used as the first transition metal, Ni was used as the second transition metal, the recombination lifetimes of the first and second samples in which selective etching was carried out for the second sample were measured, and the vertical measurement of the first sample was overlapped with the vertical measurement of the second sample to obtain the result which is shown in FIG. 6. In FIG. 6, each of the horizontal axes corresponds to the axis direction of an ingot before the sample was cut.

In case of the first sample in which Cu is diffused, the recombination lifetime of the region [Pv] was high in comparison with other point defect regions. On the other hand, in case of the second sample in which Ni was diffused, it is grasped that a region in which the recombination lifetime was highest is the region [Pi]. Accordingly, the region [Pv] and the region [Pi] can be identified from the kind of the transition metal and the dependency of the point defect region on the recombination lifetime.

The identification of the region [Pv] and the region [Pi] can be realized by utilizing property that the recombination lifetimes at respective point defect regions are remarkably different depending on the kind of the transition metal, by staining with Ni and Cu the surface of each sample which is prepared from the same site of a crystal and measuring the distribution of the recombination lifetime after diffusion treatment.

Thus, since the first measurement method of the present invention is not an identification method in which oxygen dissolved in an ingot is a measurement objective, the method is not dependent on the concentration of oxygen dissolved in an ingot. Further, since the method is not influenced by the thermal heat treatment for oxygen precipitation condition, the method can identify the regions in high precision.

(3) Second Measurement Method of Present Invention

Figure 7:
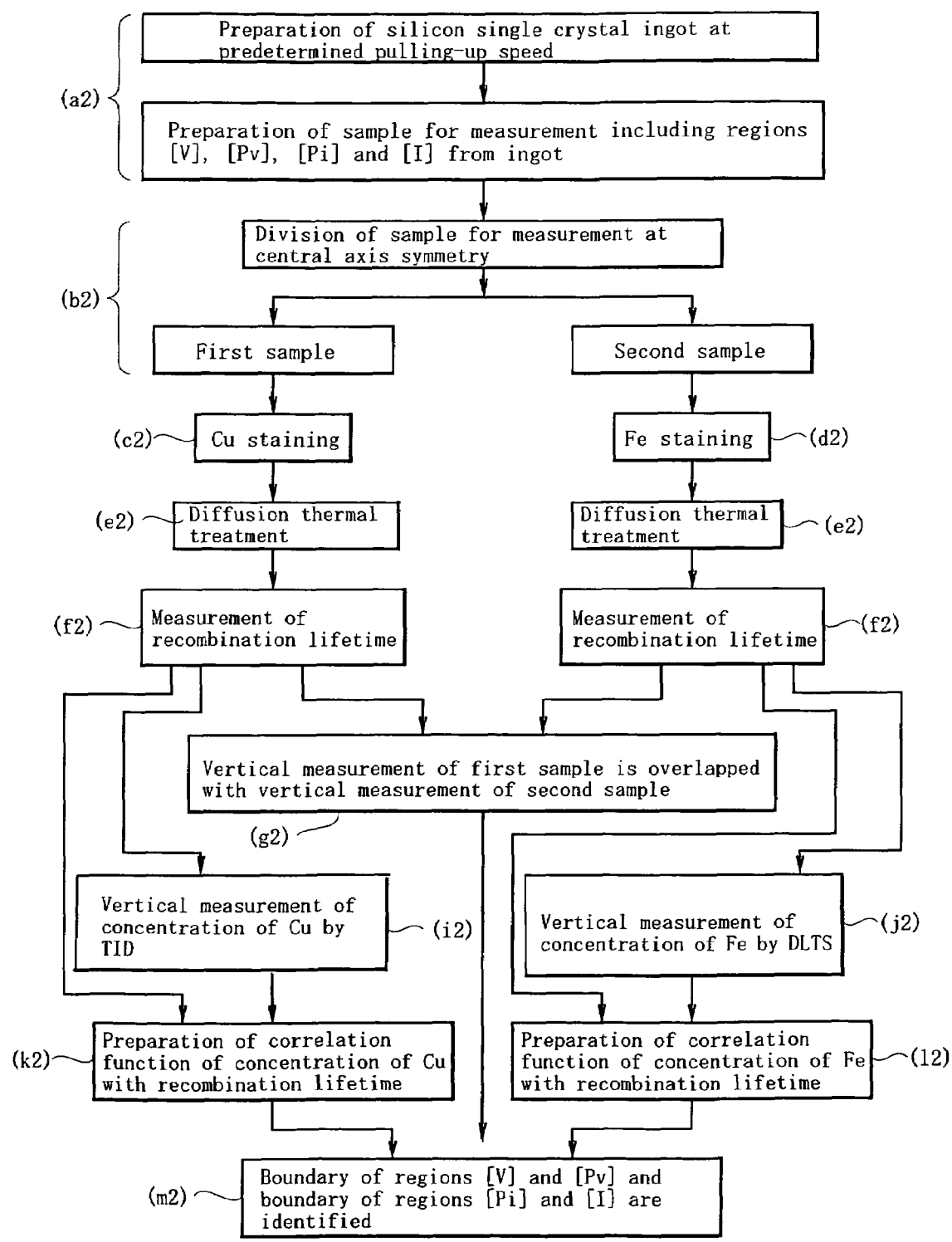
FIG. 7 is a flow chart related to a sample for measurement in the second measurement method of the present invention.

Then, the second measurement method of the present invention is illustrated based on FIG. 7.

Firstly, the steps (a2) and (b2) are similar as the steps (a1) and (b1) of the first measurement method which are previously described. Then, as shown in FIG. 7, a first transition metal solution in which a first transition metal is dissolved at a concentration of 1 to 1000 ppm is coated on the surface of the first sample to stain the first sample with the metal (step (c2)). Cu is selected for the first transition metal hereat. Then, a second transition metal solution in which a second transition metal different from the first transition metal is dissolved at a concentration of 1 to 1000 ppm is coated on the surface of the second sample to stain the second sample with the metal (step (d2)). Fe is selected for the second transition metal hereat. Diffusion thermal treatment is carried out for the first and second samples in the step (e2) at the similar condition as the step (e1) of the first measurement method previously described.

Figure 8:
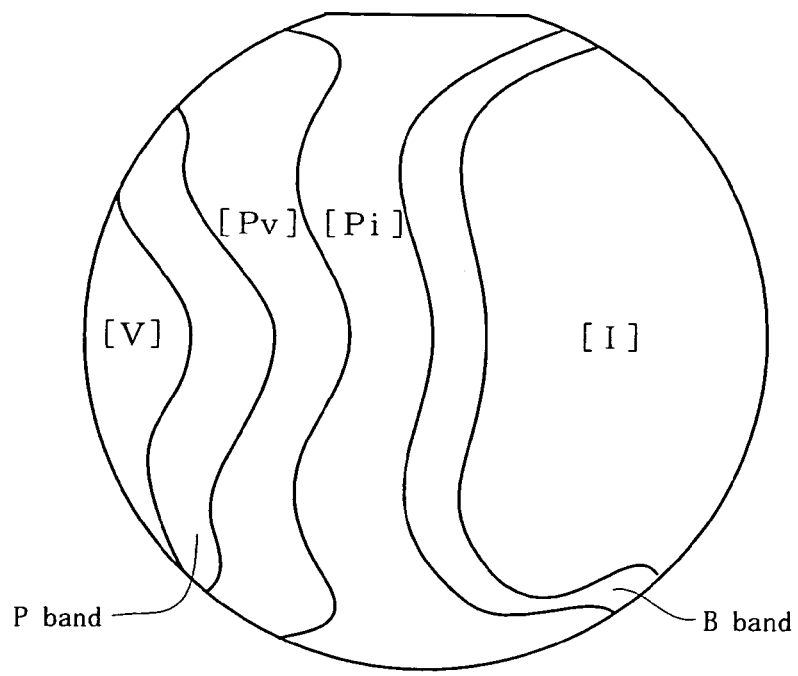
FIG. 8 is a chart showing the in-plane distribution of the recombination lifetime of Cu of the whole sample when the first sample with a low oxygen concentration in the step (f2) of the second measurement method of the present invention was measured by the LM-PCD method.
Figure 9:
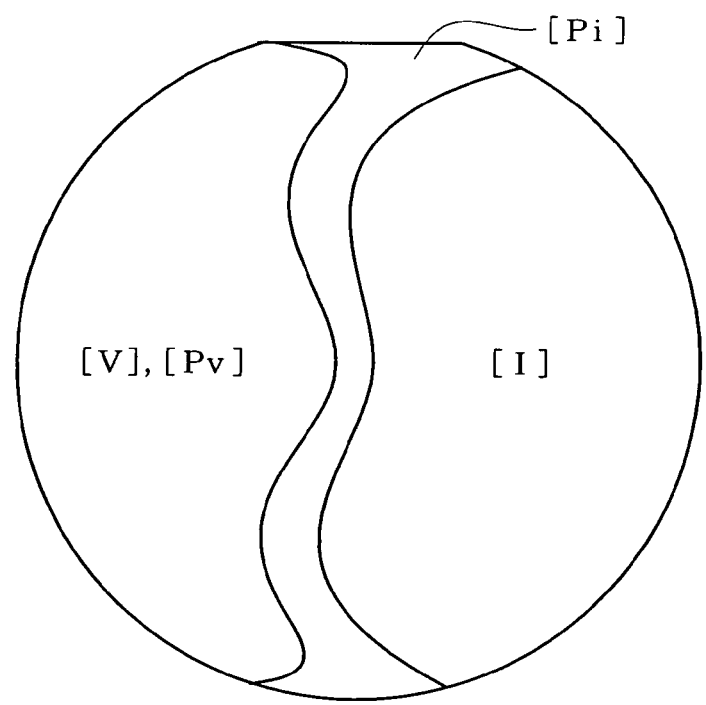
FIG. 9 is a chart showing the in-plane distribution of the recombination lifetime of Fe of the whole sample when the second sample with a low oxygen concentration in the step (f2) of the second measurement method of the present invention was measured by the LM-PCD method.

Then, the recombination lifetime of the transition metal is measured for the first and second samples (step (f2)). The LM-PCD is preferable for the measurement. The recombination lifetime is quantified over the whole sample by the LM-PCD. The recombination lifetimes of the first and second samples are respectively shown in FIGS. 8 and 9. As shown in FIG. 8, for the first sample, a region at which the recombination lifetime was highest was the region [Pi] and the lowest region was the region [V]. Further, as shown in FIG. 9, for the second sample, a region at which the recombination lifetime was lowest was the region [Pi] and the highest region was the region [Pv].

Figure 10:
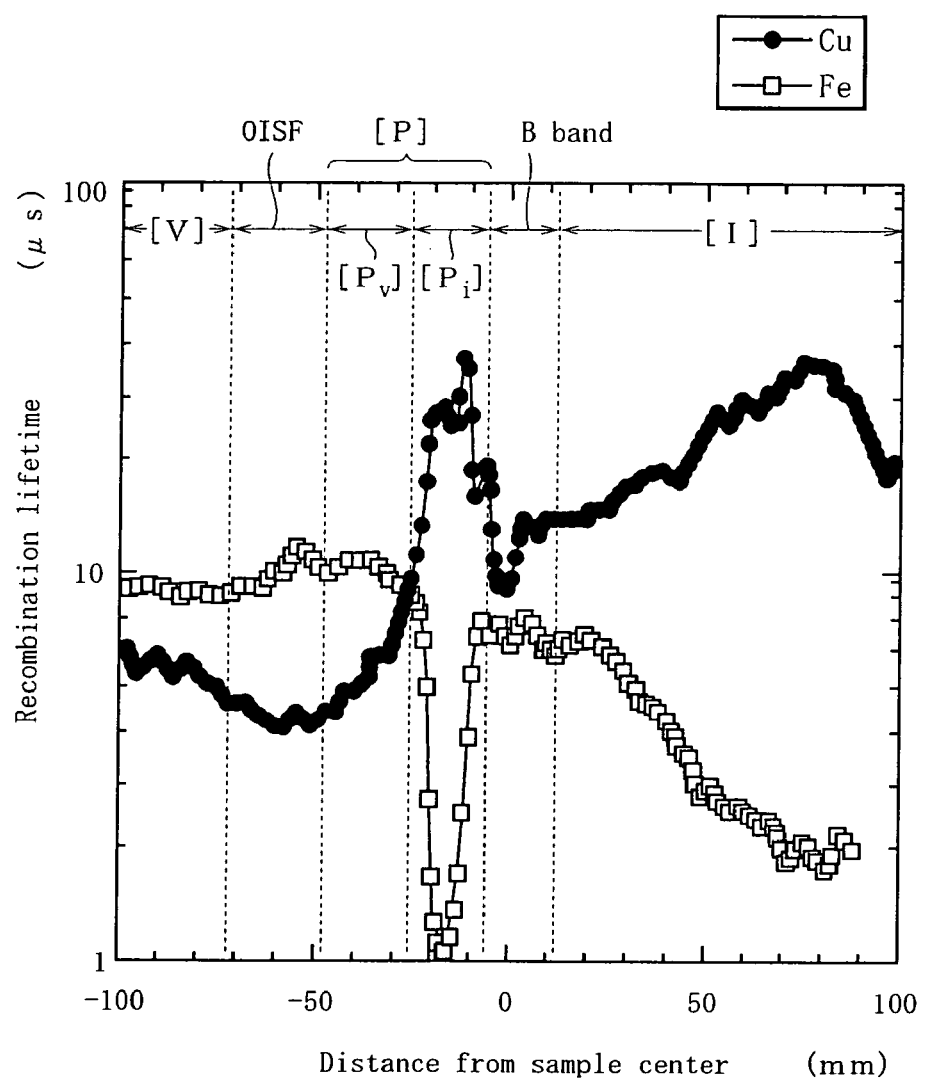
FIG. 10 is a chart showing the recombination lifetime distribution which was obtained by measuring the first and second samples with a low oxygen concentration in the step (g2) of the second measurement method of the present invention by the LM-PCD method and vertically overlapping the recombination lifetimes obtained.
Figure 1:
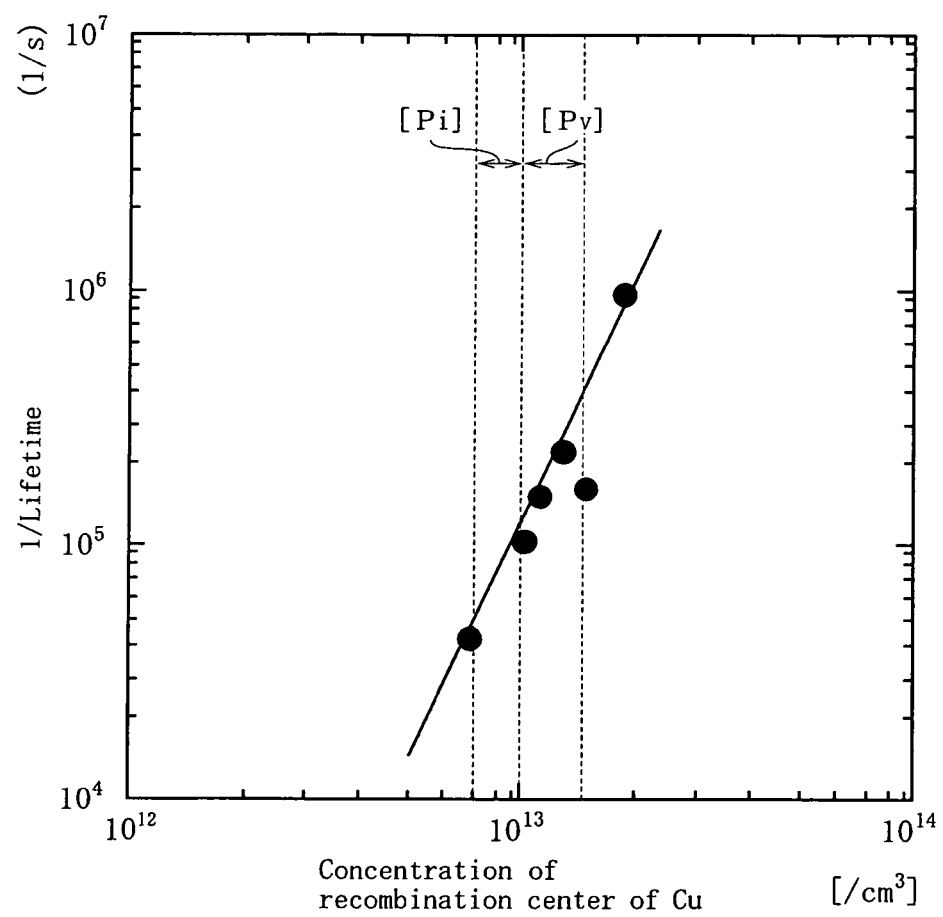
Figure 1:
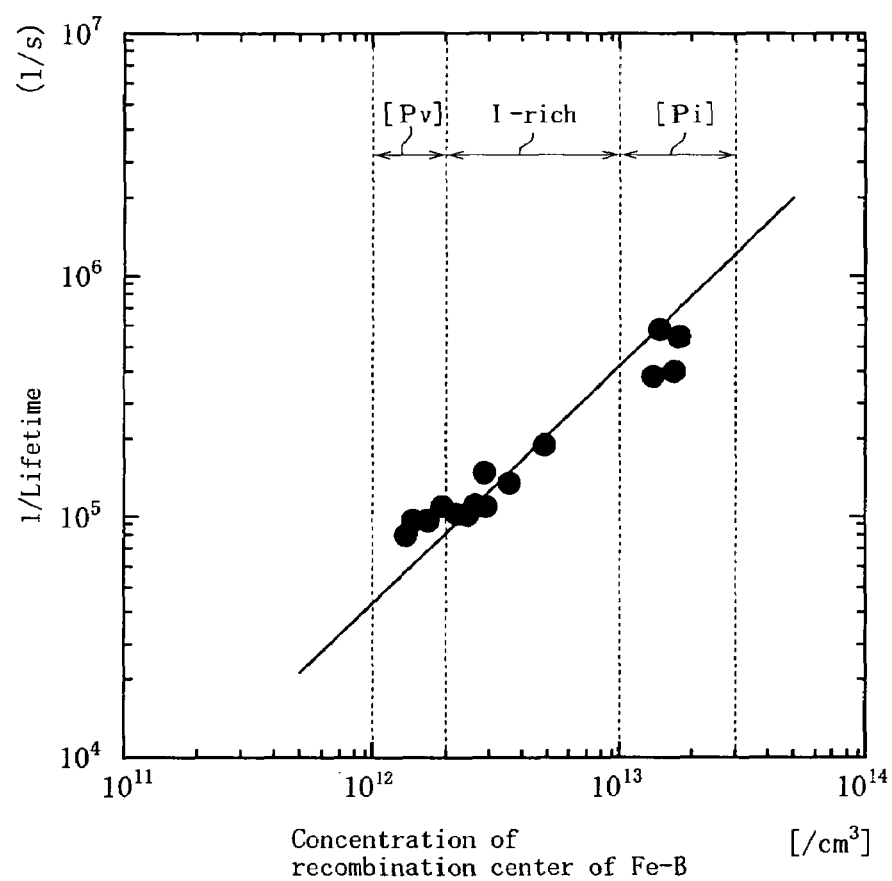

The vertical measurement of the recombination lifetime of the first sample is overlapped with the vertical measurement of the second sample (step (g2)). The result in which the vertical measurement of the first sample was overlapped with the vertical measurement of the second sample is shown in FIG. 10. In FIG. 10, each of the horizontal axes corresponds to the axis direction of an ingot before the sample was cut. In case of the first sample in which Cu was diffused, the recombination lifetime of the region [Pv] was high in comparison with other point defect regions. On the other hand, in case of the second sample in which Fe was diffused, it is grasped that a region in which the recombination lifetime was lowest was the region [Pv]. Accordingly, the region [Pv] and the region [Pi] can be identified from the dependency of the point defect region on the recombination lifetime.

Then, the vertical concentration of the first transition metal is determined by the TID method for the first sample which is thermally treated (step (i2)). The concentration of the recombination center which is formed in a sample by Cu being the first transition metal is quantified by the TID method. The TID (Transient Ion Drift) method is a method by which the concentration of Cu dissolved in a silicon single crystal is quantified from the transient capacitance property of a metal semiconductor junction diode. It is assumed that $Cu^+$ ion (interstitial copper ion) is uniformly distributed at a space charge region in thermal equilibrium condition. When a positive voltage is applied to a metal semiconductor junction diode (p-type Si), $Cu^+$ ion nearby surface is drifted to the edge of the space charge layer and a higher concentration of $Cu^+$ ion is accumulated. In accumulated condition, a portion of $Cu^+$ ion is diffused by thermal diffusion to the outside of the space charge layer at the edge of the space charge layer. It is considered in zero bias condition that the $Cu^+$ ion is thermally diffused again from the surrounding of surface and the edge of the space charge layer. The TID method is an evaluation method by which the quantification of the concentration change of the $Cu^+$ ion concentration accumulated in the space charge region from the zero bias condition can be realized by measuring the transient response attenuation property of junction capacitance.

Successively, the vertical concentration of the second transition metal is determined by the DLTS method for the second sample thermally treated (step (j2)). The concentration of the recombination center which is formed in a sample by Fe being the second transition metal is quantified by the DLTS method. The DLTS (Deep Level Transient Spectroscopy) method is a method by which a pulse voltage to a positive direction is applied in a condition in which electric field to a reverse direction is applied to junction (or interface) and carrier is captured by the level of a depletion layer.

Since it is deduced that there is correlation between both of the recombination lifetime and the concentration of recombination center, the reciprocal number of the measurement value of the recombination lifetime of the first sample obtained in the step (f2) and the measurement value of the step (j2) are plotted to prepare a correlation straight line between the concentration of the first transition metal and the recombination lifetime (step (k2)). The correlation straight line prepared in the step (k2) is shown in FIG. 11. Further, the reciprocal number of the measurement value of the recombination lifetime of the second sample obtained in the step (f2) and the measurement value of the step (j2) are plotted to prepare a correlation straight line between the concentration of the second transition metal and the recombination lifetime (step (l2)). The correlation straight line prepared in the step (l2) is shown in FIG. 12. The concentration of the recombination center at various point defect regions is determined from the correlation straight lines of FIGS. 11 and 12 and it is grasped that the concentration of the recombination center differed remarkably depending on the kind of the transition metal and point defect species.

Finally, as a result of the measurement of the step (g2), each of the boundary between the regions [V] and [Pv] and the boundary between the regions [Pi] and [I] is specified from the correlation straight line of the step (k2) and the correlation straight line of the step (l2) (step (m2)). The regions [Pv] and [Pi] can be identified by measuring the recombination lifetimes of the samples in which Cu and Fe are diffused, with the LM-PCD, by previously preparing correlation straight lines (calibration line).

Each of the samples prepared from the same site of a crystal is stained with Cu and Fe on the surface thereof, the distribution of the recombination lifetime after diffusion thermal treatment is measured, and further, the correlation straight lines (calibration line) are prepared. Thereby, the identification of the regions [Pv] and [Pi] can be realized by utilizing the property that the recombination lifetimes at various point defect regions differ remarkably depending on the kind of the transition metal.

Thus, since the second measurement method of the present invention is not an identification method in which oxygen dissolved in an ingot is a measurement objective, the method is not dependent on the concentration of oxygen dissolved in an ingot. Further, since the method is not influenced by the thermal heat treatment for oxygen precipitation condition, the method can identify the regions in high precision.

(4) Third Measurement Method of Present Invention

Figure 13:
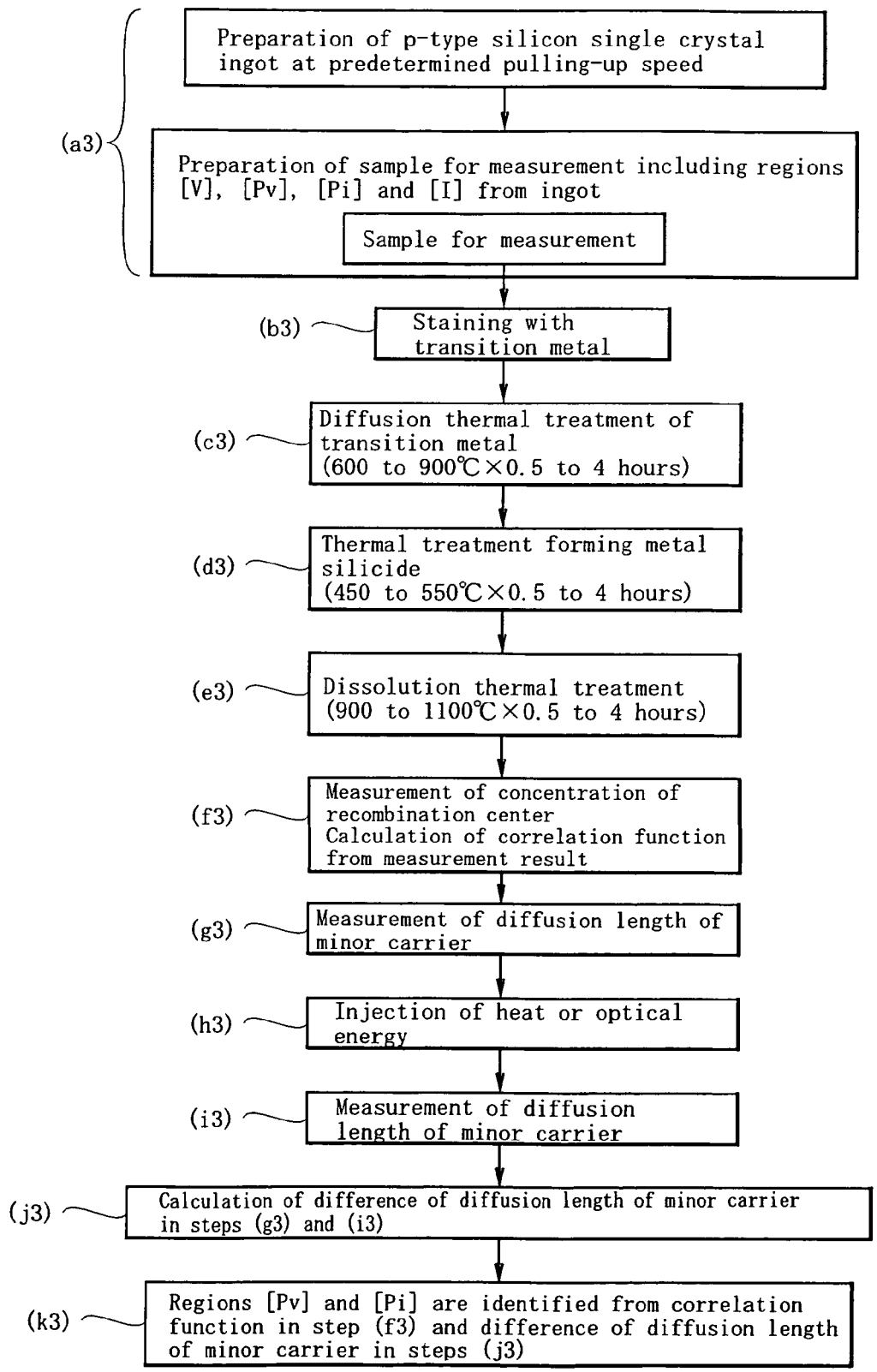
FIG. 13 is a flow chart related to a sample for measurement in the third measurement method of the present invention.

Then, the measurement method of the present invention is illustrated based on FIGS. 13 and 14.

As shown in FIG. 13, firstly, a sample for measurement is prepared from a test ingot (step (a3)). Namely, a p-type ingot is pulled up from silicon melt doped with boron which is stored in the quartz crucible of a pulling-up device based on the CZ method or MCZ method. At this time, the ingot is pulled up by changing the pulling-up speed V (mm/min.) of the ingot from a high speed (top side) to a low speed (bottom side), or a low speed (bottom side) to a high speed (top side) so that the above-mentioned regions [V], [Pv], [Pi] and [I] are contained to the axis direction of the ingot. Then, as shown in FIG. 14, sample for measurement having a thickness of 500 to 2000 µm whose surface is mirror-polished is prepared by cutting the ingot obtained in the test to axis direction and carrying out mirror-etching. In FIG. 14(a), the ingot is pulled up by changing the pulling-up speed V (mm/min.) from a high speed (top side) to a low speed (bottom side).

Then, returning to FIG. 13, a transition metal solution in which a transition metal M is dissolved at a concentration of 1 to 1000 ppm is coated on the sample to stain the sample with the metal (step (b3)). The transition metal M is preferably Fe. The transition metal solution is a solution in which the transition metal M is dissolved at a concentration of 1 to 1000 ppm and preferably 1 to 100 ppm. In particular, a standard solution for atomic absorption in which Fe is dissolved at a concentration of 10 to 100 ppm is preferred because of availability and superiority in concentration precision. The coating method includes the spin coat method, the dipping method and the like. When the concentration of the transition metal solution is less than the lower limit value, the boundaries of respective regions cannot be adequately identified, and when it exceeds the upper limit value, a trouble that the metal is precipitated on the surface of the sample is generated. In the mode of the present embodiment, a case of using Fe for the transition metal is illustrated below.

Then, the sample is rapidly heated at a temperature raising speed of 3.3° C./min. or more by rapidly charging the sample for measurement in a thermal treatment furnace which is retained at a first temperature of 600° C. to 900° C. under argon, nitrogen, oxygen, hydrogen or mixed gas atmosphere thereof, to thermally treat the sample for 0.5 hour to 4 hours, and the sample is rapidly cooled at a temperature lowering speed of 3.3° C./min. or more by rapidly taking the sample out from the thermal treatment furnace, to diffuse Fe which is coated on the surface into the whole sample (step (c3)). In the present specification, the rapid heating means that the sample is heated at a temperature raising speed of 3.3° C./min. or more, preferably 5° C./min. or more and further preferably 10° C./min. or more, and the higher the temperature raising speed is, the more preferable it is so far as the sample is not warped and cracked. Further, similarly, the rapid cooling means that the sample is cooled at a temperature lowering speed of 3.3° C./min. or more, preferably 5° C./min. or more and further preferably 10° C./min. or more. The thermal treatment method which is carried out in the present invention does not carry out lumping treatment which is carried out in a conventional thermal treatment method and carries out the charging and taking-out of the sample in a thermal treatment furnace at a speed of 10 cm/min. to 150 cm/min. in order to rapidly heat the sample at a temperature raising speed of 3.3° C./min. or more and to rapidly cool the sample at a temperature lowering speed of 3.3° C./min. or more. When Fe is diffused in the sample by carrying out the step (c3), Fe diffused forms a Fe—B bond which is a donor-acceptor pair with boron which exists at a lattice point position. Fe ion being cation is bound with B ion being anion by electrostatic attractive force and the bond forms a deep energy level of 0.1 eV in the energy band gap of silicon. The concentration of the Fe—B bond of the sample to which diffusion thermal treatment is carried out depends on the concentration of oxygen dissolved in the crystal. This occurs because the formation density of precipitation nuclei differs in the respective regions of intrinsic point defects. For example, in case of a crystal with a high concentration of oxygen, precipitation at respective regions is accelerated and the difference between the concentrations of Fe—B in the regions [Pv] and [Pi] becomes unclear. Accordingly, a sample to which a mere diffusion thermal treatment is carried out cannot specify the concentration of Fe—B in the respective regions. It is preferable in the diffusion thermal treatment to carry out thermal treatment at the first temperature of 800° C. to 900° C. for 0.5 to 1 hour. When the first temperature and the retention time are less than the lower limit value, the transition metal is not adequately diffused in the sample.

Then, the sample is rapidly heated at a temperature raising speed of 3.3° C./min. or more by rapidly charging the sample for measurement in a thermal treatment furnace which is retained at a second temperature of 450° C. to 550° C., which is lower than the first temperature by 150° C. to 450° C., under argon, nitrogen, oxygen, hydrogen or mixed gas atmosphere thereof, to thermally treat the sample for 0.5 hour to 4 hours, and the sample is rapidly cooled at a temperature lowering speed of 3.3° C./min. or more by rapidly taking the sample out from the thermal treatment furnace, to form metal silicide from Fe which is diffused into the whole sample (step (d3)). The charging and taking-out of the sample in the thermal treatment furnace in the step (d3) is carried out at a speed of 10 cm/min. to 150 cm/min. in like manner as the above-mentioned step (c3). The portion of interstitial Fe, which is diffused in the sample and forms Fe—B bonds at the respective regions, forms $\beta$-FeSi$_2$. Consequently, the concentration of the interstitial Fe interstitially dissolved is decreased. However, it is considered that the preparation rate of $\beta$-FeSi$_2$ at the regions [Pv] and [Pi] differs depending on the kind of intrinsic point defects at the respective regions. For example, since the preparation rate of $\beta$-FeSi$_2$ at the region [Pi] is high in comparison with the regions [Pv], the difference of the concentration of Fe—B at the respective regions becomes unclear. The step (d3) is carried out in order to make constant in a plane the concentration of Fe dissolved in the crystal, utilizing the dependency of $\beta$-FeSi$_2$ on the preparation rate and the kind of point defects at the respective regions. It is preferable in the silicide forming thermal treatment that the thermal treatment is carried out at the second temperature of 500° C. to 550° C. for 0.5 to 1 hour. When the second temperature and the retention time are less than the lower limit value, the metal silicide is not adequately formed. Further, when they exceed the upper limit value, a trouble that oxygen precipitate is formed in the crystal is generated.

Further, the sample is rapidly heated at a temperature raising speed of 3.3° C./min. or more by rapidly charging the sample in a thermal treatment furnace which is retained at a third temperature of 900° C. to 1100° C., which is higher than the second temperature by 450° C. to 550° C., under argon, nitrogen, oxygen, hydrogen or mixed gas atmosphere thereof, to thermally treat the sample for 0.5 hour to 4 hours, and the sample is rapidly cooled at a temperature lowering speed of 3.3° C./min. or more by rapidly taking the sample out from the thermal treatment furnace, to dissolve metal silicide which is formed in the inside of the sample (step (e3)). The charging and taking-out of the sample in the thermal treatment furnace in the step (e3) is carried out at a speed of 10 cm/min. to 150 cm/min. in like manner as the above-mentioned steps (c3) and (d3). The phase of $\beta$-FeSi$_2$ which is formed in the above-mentioned step (d3) is changed to $\alpha$-FeSi$_2$ by carrying out the above-mentioned step (e3), to be electrically inactive. Further, the interstitial Fe which retained a Fe—B bond without forming $\beta$-FeSi$_2$ at the above-mentioned step (d3) is discharged. It is preferable in the dissolution thermal treatment that the thermal treatment is carried out at 900° C. to 1000° C. for 0.5 to 1 hour. When the third temperature and the retention time are less than the lower limit value, the metal silicide is not adequately formed. Further, when they exceed the upper limit value, a trouble that oxygen precipitate is formed in the crystal is generated.

The concentration of recombination center which Fe forms in the whole sample to which the various thermal treatments of the above-mentioned steps (c3) to (e3) are carried out is measured by the DLTS, and a correlation function is determined based on the measurement value (step (f3)).

The diffusion length of minor carrier of the sample is measured by the SPV method (surface photovoltage method) (step (g3)). In the step (g3) and the step (i3) described later, only the interstitial Fe dissolved in the crystal and which is an electrically active defect is measured by the SPV method, utilizing the dependency of the re-discharge amount of Fe in the respective regions on the point defect species.

Heat or optical energy is injected in the sample (step (h3)). A white light source of about 100 W is preferably irradiated to the sample. The Fe—B bond which exists in the sample become disjunct easily by irradiation of the white light source, and a deep energy level of 0.45 eV is formed in the energy band gap of the silicon single crystal. The diffusion length of minor carrier is decreased by the disjunction. The Fe ion being cation which become disjunct by injection of heat or optical energy is diffused in the inter-lattice of the crystal and forms again the Fe—B bond with most adjacent boron to carry out a reversible reaction.

Then, the diffusion length of minor carrier of the sample to which heat or optical energy is injected is measured by the SPV method (step (i3)).

The difference of the diffusion length of minor carrier is determined from the measurement value in the above-mentioned step (g3) before irradiation of the white light source and the measurement value in the above-mentioned step (i3) after irradiation (step (j3)). The difference obtained from the above-mentioned steps (g3) and (i3) is correlated with the concentration of Fe dissolved in the sample.

The regions [Pi] and [Pv] and boundary thereof are specified from the correlation function obtained in the above-mentioned step (f3) and the diffusion length of minor carrier obtained in the above-mentioned step (j3) (step (k3)). Since the re-discharge amount of Fe depends remarkably on the kind of the point defect regions, the regions [Pi] and [Pv] and boundary thereof can be specified by determining the product of the correlation function with the difference of the diffusion length of minor carrier.

The quantification of the in-plane concentration of Fe is realized by respectively measuring the diffusion lengths at an assigned position of the wafer using the measurement value of the diffusion length of minor carrier before and after irradiation of the white light source, by assembling the correlation function preliminarily obtained from the DLTS, in the measurement soft of an SPV measurement device.

The transition metal (Fe) which is trapped with boron being a gettering sink and formed a Fe—B bond is interstitially discharged again by dissolution thermal treatment at the region [Pi] in which the concentration of vacancy is a low concentration. Fe which formed a Fe—B bond is introduced in a vacancy by dissolution thermal treatment at the region [Pv] in which the concentration of vacancy is high, and precipitation is accelerated. Accordingly, the concentration of the transition metal in the region [Pi] is a concentration of about 3-fold or more in comparison with the concentration of the transition metal in the region [Pv]. Thus, the boundaries of the respective regions can be cleared by measuring the concentration of the recombination center which Fe forms in the whole sample.

Since the measurement method of the present invention is not an identification method in which oxygen dissolved in the ingot is an objective for measurement, the method is not dependent on the concentration of oxygen dissolved in the ingot and the thermal heat treatment for oxygen precipitation for a long time is also unnecessary. Since the method is not influenced by the thermal heat treatment for oxygen precipitation condition, the method can identify the regions in high precision.

Then, Examples of the present invention are specifically illustrated together with Comparative Examples.

EXAMPLES 1 TO 3 AND COMPARATIVE EXAMPLES 1 TO 5

Firstly, an ingot was pulled up by changing a pulling-up speed from silicon melt doped with boron so as to respectively include regions [V], [Pv], [Pi] and [I], and the ingot was sliced to diameter direction at a position including the regions [Pv] and [Pi] which are situated at the A-A line of FIG. 23, to obtain 8 samples. Then, a solution with 100 ppm of Fe was coated on the surface of the 8 samples to stain the surface of the samples with the metal. Then, thermal treatment was carried out to each of the 8 samples at conditions shown in Table 1 below.

TABLE 1

| | Condition of thermal treatment | | |
|---|---|---|---|
| Example 1 | $N_2$ atmosphere, 900° C. × 1 hour | $N_2$ atmosphere, 550° C. × 1 hour | $N_2$ atmosphere, 900° C. × 1 hour |
| Example 2 | $N_2$ atmosphere, 900° C. × 1 hour | $N_2$ atmosphere, 550° C. × 1 hour | $N_2$ atmosphere, 1000° C. × 1 hour |
| Example 3 | $N_2$ atmosphere, 900° C. × 1 hour | $N_2$ atmosphere, 550° C. × 1 hour | $N_2$ atmosphere, 1100° C. × 1 hour |
| Comparative Example 1 | $N_2$ atmosphere, 900° C. × 1 hour | — | — |
| Comparative Example 2 | $N_2$ atmosphere, 900° C. × 1 hour | $N_2$ atmosphere, 550° C. × 1 hour | — |
| Comparative Example 3 | $N_2$ atmosphere, 900° C. × 1 hour | $N_2$ atmosphere, 550° C. × 1 hour | $N_2$ atmosphere, 600° C. × 1 hour |
| Comparative Example 4 | $N_2$ atmosphere, 900° C. × 1 hour | $N_2$ atmosphere, 550° C. × 1 hour | $N_2$ atmosphere, 750° C. × 1 hour |
| Comparative Example 5 | $N_2$ atmosphere, 900° C. × 1 hour | $N_2$ atmosphere, 550° C. × 1 hour | $N_2$ atmosphere, 800° C. × 1 hour |

The concentrations of recombination center which Fe formed in the whole sample were measured by the DLTS method with respect to the samples which terminated the thermal treatment at various conditions and correlation functions were determined based on the measurement values. Successively, the diffusion lengths of minor carrier were measured using the SPV method. A white light source was irradiated on each of the samples. The diffusion lengths of minor carrier after irradiation of the white light source were measured using the SPV method. The differences of the diffusion lengths of minor carrier before and after irradiation of the white light source were determined. The diffusion lengths (in-plane distribution) of the concentration of the recombination center of Fe in the samples were measured from the correlation functions and the differences of the diffusion lengths of minor carrier.

Figure 15:
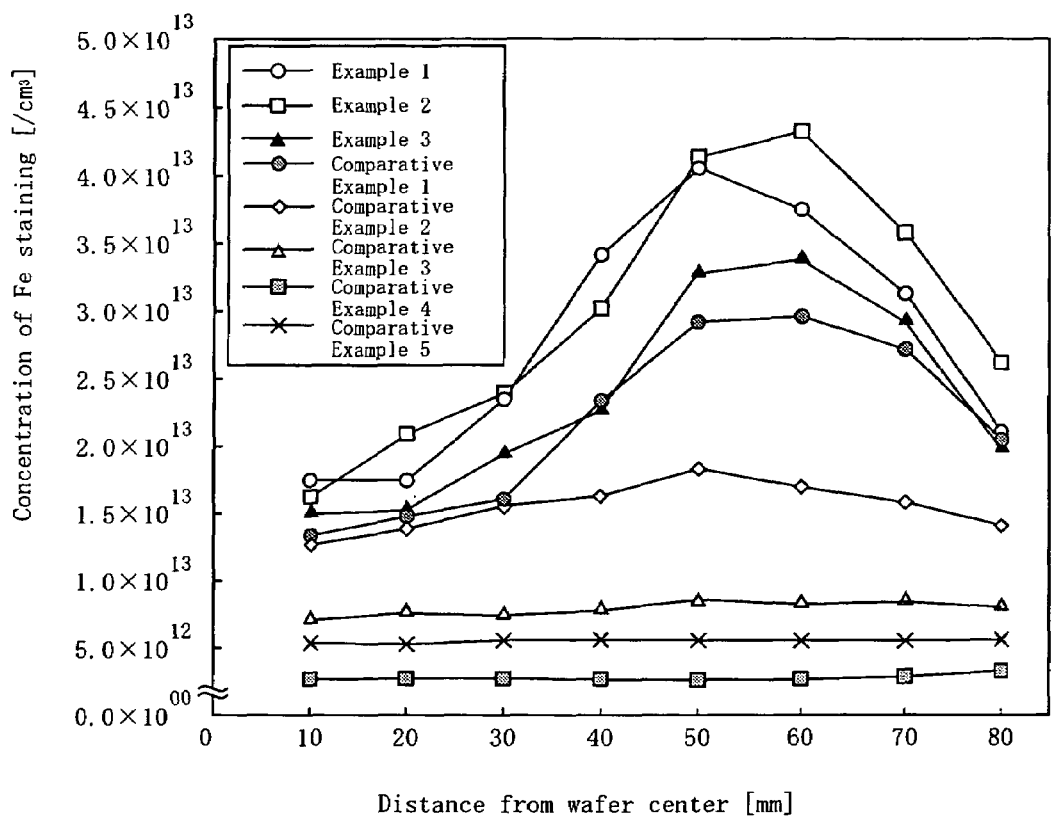
FIG. 15 is a chart showing the distributions of the concentration of Fe recombination center of Examples 1 to 3 and Comparative Examples 1 to 5.
Figure 16:
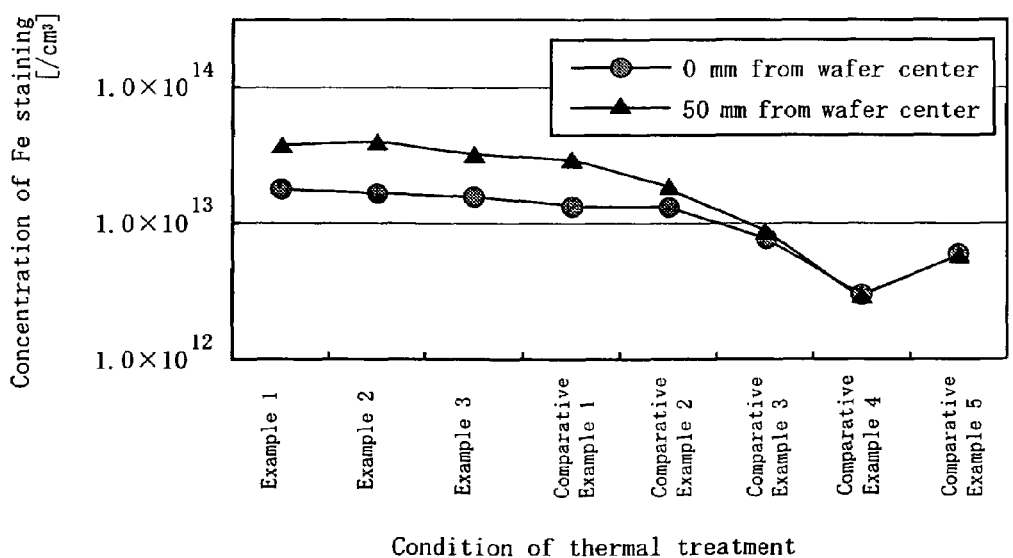
FIG. 16 is a chart showing the distribution of the concentration of Fe recombination center at 0 mm to 50 mm from the wafer center of FIG. 15.
Figure 17:
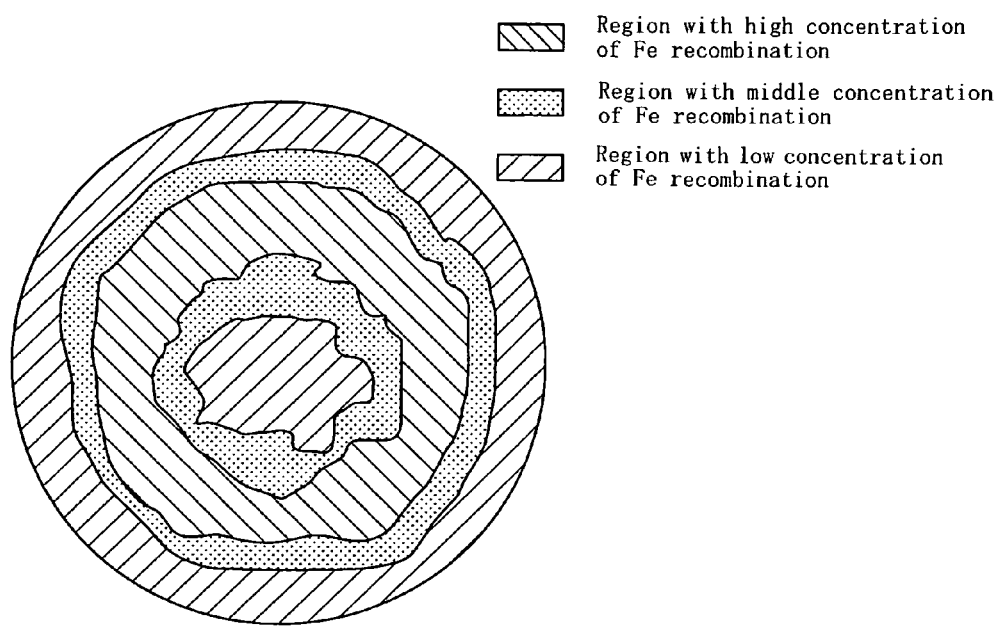
FIG. 17 is a chart showing the in-plane distribution of the wafer of the concentration of Fe in the regions [Pv] and [Pi] in Example 2.
Figure 18:
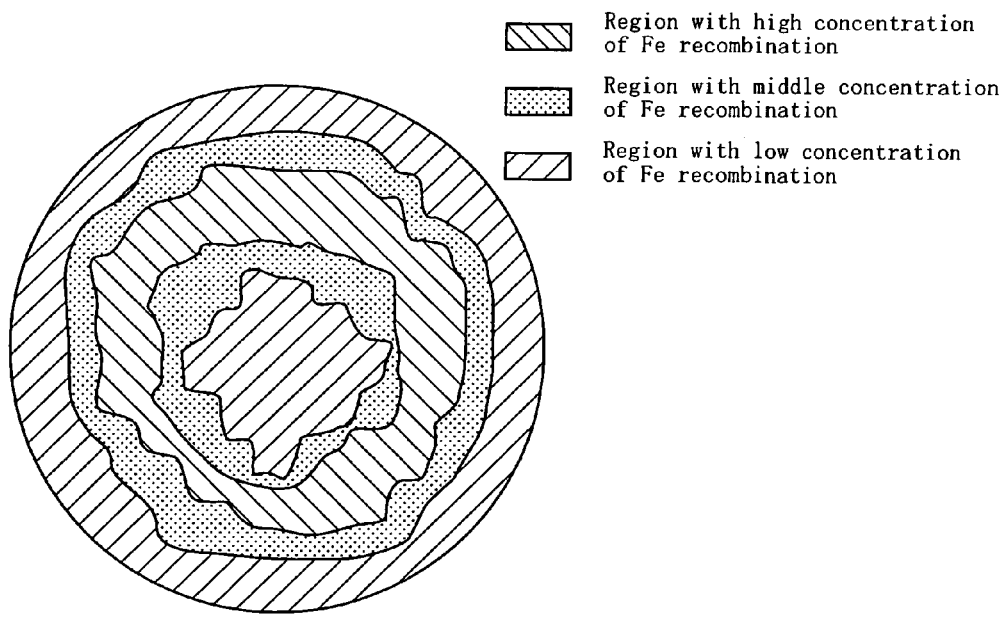
FIG. 18 is a chart showing the distribution of the in-plane wafer of the concentration of Fe in the regions [Pv] and [Pi] in Example 3.
Figure 19:
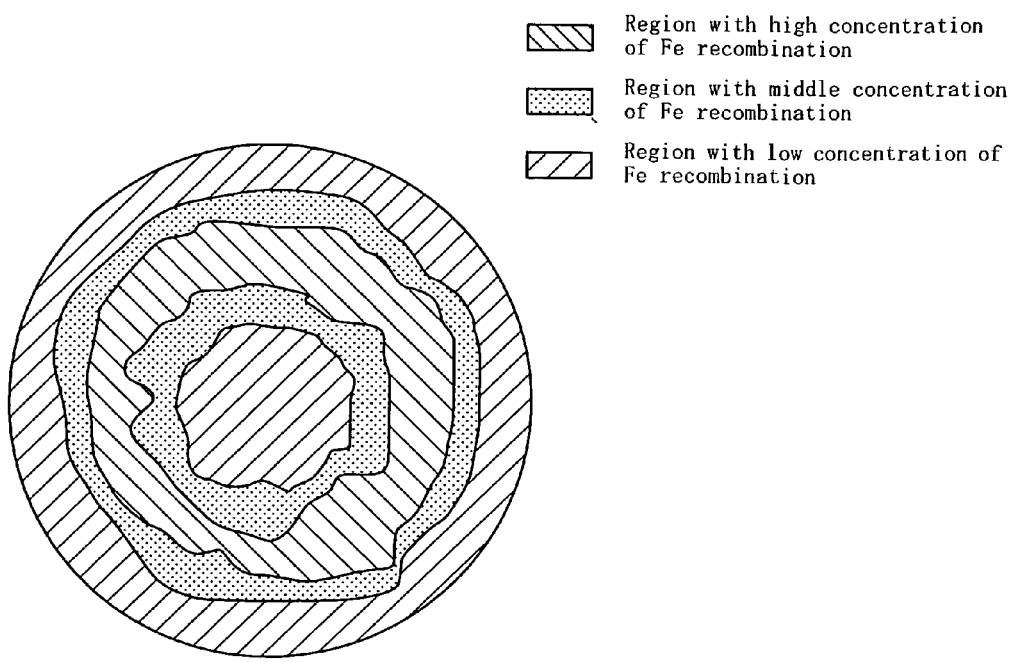
FIG. 19 is a chart showing the in-plane distribution of the wafer of the concentration of Fe in the regions [Pv] and [Pi] in Comparative Example 1.
Figure 20:
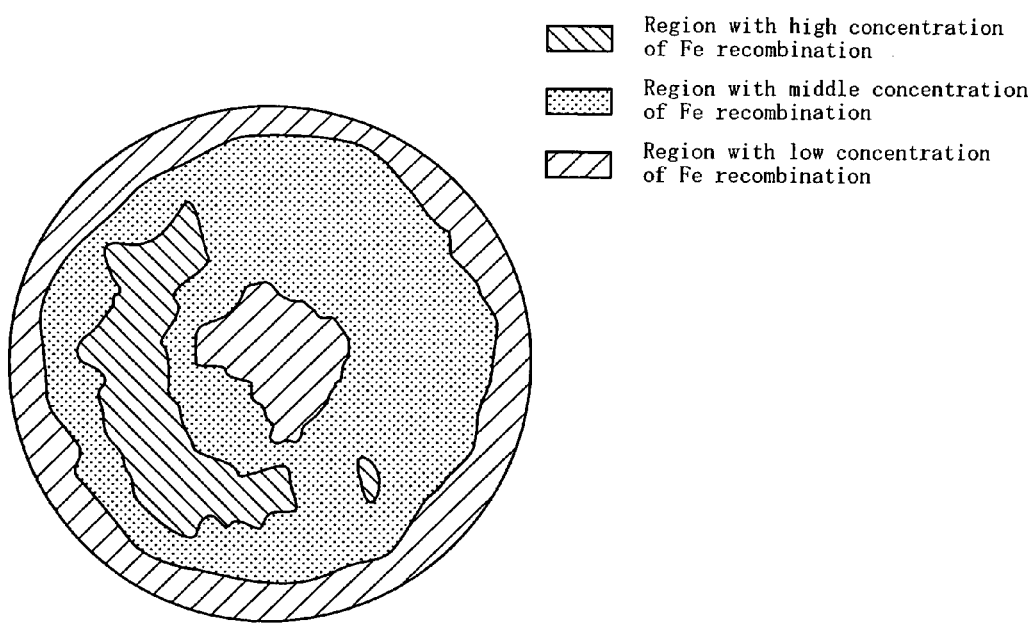
FIG. 20 is a chart showing the in-plane distribution of the wafer of the concentration of Fe in the regions [Pv] and [Pi] in Comparative Example 2.
Figure 21:
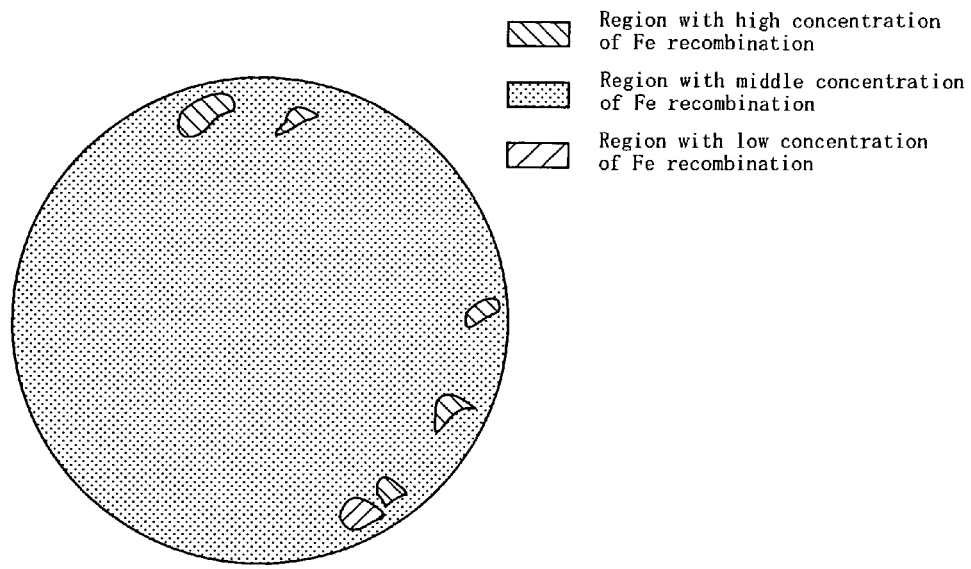
FIG. 21 is a chart showing the in-plane distribution of the wafer of the concentration of Fe in the regions [Pv] and [Pi] in Comparative Example 4.
Figure 22:
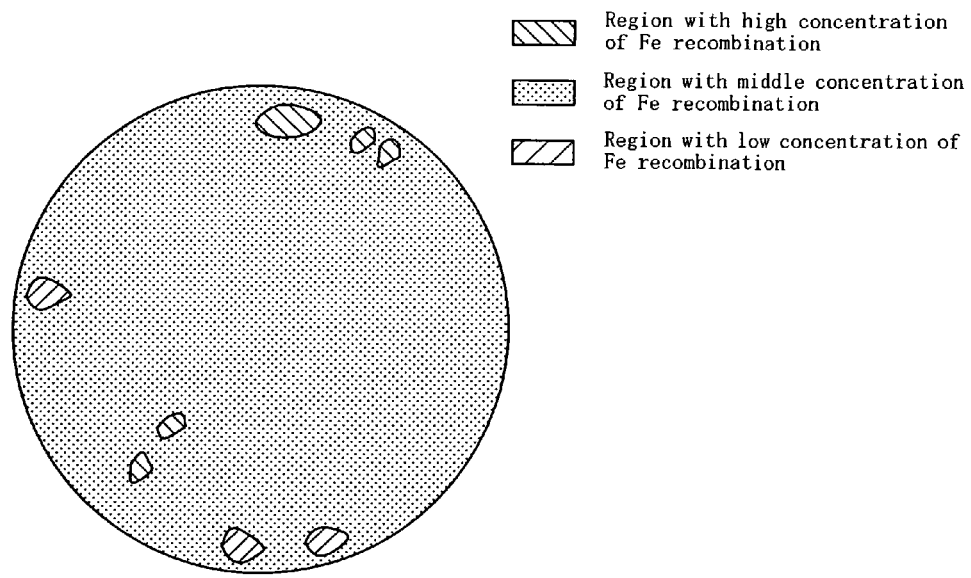
FIG. 22 is a chart showing the in-plane distribution of the wafer of the concentration of Fe in the regions [Pv] and [Pi] in Comparative Example 5.

The distribution to diameter direction of the concentration of recombination center of Fe which were obtained form various point defect regions in the Fe diffused samples is shown in FIG. 15. Further, the distribution chart of the concentration of the recombination centers of Fe at 0 mm to 50 mm from the wafer center of FIG. 15 is shown in FIG. 16. Furthermore, the distribution charts of the in-plane wafer of the concentration of Fe at the regions [Pv] and [Pi] in Examples 2 and 3 and Comparative Examples 1, 2, 4 and 5 are shown in FIGS. 17 to 22.

As cleared from FIG. 15, it is grasped that the concentration Fe differs remarkably in the respective regions depending on the temperature condition of the thermal treatment. It was the region [Pi] of Example 2 that the concentration of Fe was highest and it was the region [Pv] of Comparative Example 4 that the concentration of Fe was lowest. Thus, it is grasped that the concentration of Fe detected differs depending on the condition of thermal treatment and the respective regions. The result shows that the identification and judgment of the respective regions can be carried out using the dependency of the concentration of Fe on the temperature of dissolution thermal treatment.

As cleared from FIG. 16, it was grasped that the ratio of the concentration of Fe of the region [Pv] to that of the region [Pi] was 3-fold or more in Examples 1 to 3 in which the dissolution thermal treatment at 900° C. or more was carried out.

FIGS. 17 to 22 are the in-plane distribution of the wafer of the concentration of Fe at the regions [Pv] and [Pi] in Examples 2 and 3 and Comparative Examples 1, 2, 4 and 5. Since Fe is not adequately recombined in Comparative Example 1 in which only diffusion thermal treatment was carried out and Comparative Example 2 in which melting thermal treatment was not carried out, an adequate in-plane distribution was not obtained and the respective regions cannot be identified. In Comparative Examples 4 and 5 in which the dissolution thermal treatment at less than 900° C. was carried out, an adequate recombination distribution was not obtained and the respective regions cannot be identified. To the contrary, in Examples 2 and 3 in which the dissolution thermal treatment at 900° C. or more was carried out, the difference between the concentration of Fe of the region [Pv] to that of the region [Pi] was clear and it was grasped that the boundary regions of point defects can be evaluated in high precision.

INDUSTRIAL APPLICABILITY

The method for measuring the point defect distribution of a silicon single crystal ingot of the present invention can identify the regions [Pv] and [Pi] in the ingot and boundary thereof with high precision and in a short time. Since the regions [Pv] and [Pi] can be clearly judged by the present invention, V/G control which has been a problem when a defect-free silicon single crystal is conventionally produced can be precisely controlled and the stable mass production of a defect-free silicon single crystal can be realized.

What is claimed is:

1. A method for measuring the point defect distribution of a silicon single crystal ingot, comprising
   (a1) a step of preparing a sample for measurement including regions [V], [Pv], [Pi] and [I] by cutting to an axial direction a silicon single crystal ingot which is pulled up by changing a pulling-up speed from silicon melt so as to include the central axis of the single crystal ingot,
   (b1) a step of preparing a first sample and a second sample by dividing the sample for measurement into two so as to be symmetrical against the central axis of the ingot,
   (c1) a step of coating a first transition metal solution dissolving a first transition metal at a concentration of 1 to 1000 ppm on the surface of the first sample to stain the sample with the metal,
   (d1) a step of coating a second transition metal solution dissolving a second transition metal different from the first transition metal at a concentration of 1 to 1000 ppm on the surface of the second sample to stain the sample with the metal,
   (e1) a diffusion thermal treatment step of thermally treating the first and second samples stained with the metals at 600° C. to 1150° C. for 0.5 hour to 30 hours under argon, nitrogen, oxygen, hydrogen or mixed gas atmosphere thereof and diffusing the first and second transition metals which are respectively coated on the surface of the first and second samples into the inside of the samples, (f1) a step of respectively measuring recombination lifetimes in the whole of the first and second samples which are thermally treated, (g1) a step of overlapping the vertical measurement of the first sample of the step (f1) on the vertical measurement of the second sample, and (h1) a step of respectively specifying the boundary between the regions [Pi] and [I] and the boundary between the regions [V] and [Pv] from the measurement result of the step (g1), Provided that the region [V] is a region having defects where the vacancy type point defect is dominant and excessive vacancies are agglomerated, the region [Pv] is a region having defects where the vacancy type point defect is dominant and vacancies are not agglomerated, the region [Pi] is a region having defects where the interstitial silicon type point defect is dominant and interstitial silicons are not agglomerated, and the region [I] is a region having defects where the interstitial silicon type point defect is dominant and interstitial silicons are agglomerated.

2. The measurement method according to claim 1, wherein the first transition metal is Cu or Fe and the second transition metal is Ni or Co.

3. The measurement method according to claim 2, further comprising a step of selectively etching the surface of the second sample which is thermally treated with the step (e1) when the second transition metal with which the second sample is metal-stained is Ni.

4. The measurement method according to claim 1, wherein the diffusion thermal treatment step of the first and second transition metals in the step (e1) or (e2) is a thermal treatment at 600° C. to 1150° C. for 0.5 hour to 24 hours.

5. The measurement method according to claim 1, wherein the measurement of the recombination lifetime in the step (f1) or (f2) is measured using the LM-PCD (laser/microwave photoconductance decay method).

6. The measurement method according to claim 1, further comprising a step of selectively etching the surface of the second sample which is thermally treated with the step (e1) when the second transition metal with which the second sample is metal-stained is Ni.

7. A method for measuring the point defect distribution of a silicon single crystal ingot, comprising (a2) a step of preparing a sample for measurement including regions [V], [Pv], [Pi] and [I] by cutting to an axial direction a silicon single crystal ingot which is pulled up by changing a pulling-up speed from silicon melt so as to include the central axis of the single crystal ingot, (b2) a step of preparing a first sample and a second sample by dividing the sample for measurement into two so as to be symmetrical against the central axis of the ingot, (c2) a step of coating a first transition metal solution dissolving a first transition metal at a concentration of 1 to 1000 ppm on the surface of the first sample to stain the sample with the metal, (d2) a step of coating a second transition metal solution dissolving a second transition metal different from the first transition metal at a concentration of 1 to 1000 ppm on the surface of the second sample to stain the sample with the metal, (e2) a diffusion thermal treatment step of thermally treating the first and second samples stained with the metals at 600° C. to 1150° C. for 0.5 hour to 30 hours under argon, nitrogen, oxygen, hydrogen or mixed gas atmosphere thereof and diffusing the first and second transition metals which are respectively coated on the surface of the first and second samples into the inside of the samples, (f2) a step of respectively measuring recombination lifetimes in the whole of the first and second samples which are thermally treated, (g2) a step of overlapping the vertical measurement of the first sample of the step (f2) on the vertical measurement of the second sample, (i2) a step of determining the vertical concentration of the first transition metal by the TID method with respect to the first sample which is thermally treated, (j2) a step of determining the vertical concentration of the second transition metal by the DLTS method with respect to the second sample which is thermally treated, (k2) a step of preparing a correlation straight line between the concentration of the first transition metal and the recombination lifetime from the vertical measurement result in the first sample of the step (f2) and the measurement result of the step (i2), (l2) a step of preparing a correlation straight line between the concentration of the second transition metal and the recombination lifetime from the vertical measurement result in the second sample of the step (f2) and the measurement result of the step (j2), and (m2) a step of respectively specifying the boundary between the regions [V] and [Pv] and the boundary between the regions [Pi] and [I] from the measurement result of the step (g2), the correlation straight line of the step (k2) and the correlation straight line of the step (l2), Provided that the regions [V], [Pv], [Pi] and [I] have the same meaning as those respectively described in claim 1, the TID method is a method of quantifying the concentration of Cu dissolved in a silicon single crystal from the analysis of transient capacitance property of a metal semiconductor junction diode, and the DLTS method is a method of applying pulse voltage to a positive direction in a condition in which electric field to a reverse direction against the junction (or interface) and capturing a carrier with a level in a depletion layer.

8. The measurement method according to claim 7, wherein the first transition metal is Cu and the second transition metal is Fe.

9. The measurement method according to claim 7, wherein the diffusion thermal treatment step of the first and second transition metals in the step (e1) or (e2) is a thermal treatment at 600° C. to 1150° C. for 0.5 hour to 24 hours.

10. The measurement method according to claim 7, wherein the measurement of the recombination lifetime in the step (f1) or (f2) is measured using the LM-PCD (laser/microwave photoconductance decay method).

11. A method for measuring the point defect distribution of a silicon single crystal ingot, comprising (a3) a step of preparing a sample for measurement including regions [V], [Pv], [Pi] and [I] by cutting to an axial direction a p-type silicon single crystal ingot which is pulled up by changing a pulling-up speed from silicon melt doped with boron, (b3) a step of coating a transition metal solution dissolving a transition metal M at a concentration of 1 to 1000 ppm on the surface of the sample to stain the sample with the metal, (c3) a diffusion thermal treatment step of rapidly charging the sample stained with the metal into a thermally treating furnace which is retained at a first temperature of 600° C. to 900° C., under argon, nitrogen, oxygen, hydrogen or mixed gas atmosphere thereof, thereby rapidly heating the sample at a temperature raising speed of 3.3° C./min. or more to thermally treat the sample for 0.5 hour to 4 hours, rapidly cooling the sample at a temperature cooling speed of 3.3° C./min. or more by rapidly taking out the sample from the thermally treating furnace and diffusing the transition metal M which is coated on the surface of the sample into the inside of the sample, (d3) a silicide forming thermal treatment step of rapidly charging the sample into a thermally treating furnace which is retained at a second temperature of 450° C. to 550° C. lower than the first temperature by 150° C. to 450° C., under argon, nitrogen, oxygen, hydrogen or mixed gas atmosphere thereof, thereby rapidly heating the sample at a temperature raising speed of 3.3° C./min. or more to thermally treat the sample for 0.5 hour to 4 hours, rapidly cooling the sample at a temperature cooling speed of 3.3° C./min. or more by rapidly taking out the sample from the thermally treating furnace and forming metal silicide from the transition metal M which is diffused into the inside of the sample, (e3) a dissolution thermal treatment step of rapidly charging the sample into a thermally treating furnace which is retained at a third temperature of 900° C. to 1100° C. higher than the second temperature by 450° C. to 550° C., under argon, nitrogen, oxygen, hydrogen or mixed gas atmosphere thereof, thereby rapidly heating the sample at a temperature raising speed of 3.3° C./min. or more to thermally treat the sample for 0.5 hour to 4 hours, rapidly cooling the sample at a temperature cooling speed of 3.3° C./min. or more by rapidly taking out the sample from the thermally treating furnace and dissolving the metal silicide which is formed in the inside of the sample, (f3) a step of measuring the concentration of the recombination center which the transition metal M forms in the whole sample which undergoes the dissolution thermal treatment and determining a correlation function from the measurement result, (g3) a step of measuring the diffusion length of minor carrier in the whole sample which undergoes the dissolution thermal treatment, (h3) a step of injecting heat or optical energy in the sample, (i3) a step of measuring the diffusion length of minor carrier in the whole sample in which the heat or optical energy is injected, (j3) a step of determining the difference of the diffusion lengths of minor carrier from the measurement result of the step (g3) and the measurement result of the step (i3), and (k3) a step of specifying the regions [Pv] and [Pi] in the sample and boundary thereof from the correlation function obtained in the step (f3) and the difference of the diffusion lengths of minor carrier obtained from the step (J3), Provided that the region [V] is a region having defects where the vacancy type point defect is dominant and excessively saturated vacancies are agglomerated, the region [Pv] is a region having defects where the vacancy type point defect is dominant and vacancies are not agglomerated, the region [Pi] is a region having defects where the interstitial silicon type point defect is dominant and interstitial silicons are not agglomerated, and the region [I] is a region having defects where the interstitial silicon type point defect is dominant and interstitial silicons are agglomerated.

12. The measurement method according to claim 11, wherein the transition metal M is Fe.

13. The measurement method according to claim 11, wherein the minor carrier diffusion lengths in the steps (g3) and (i3) are measured using the SPV (surface photovoltage method).

14. The measurement method according to claim 11, wherein the concentration of recombination center of the transition metal M in the step (f3) is measured using the DLTS (deep level transient spectroscopy).

* * * * *